United States Patent
He et al.

(10) Patent No.: US 11,917,897 B2
(45) Date of Patent: Feb. 27, 2024

(54) PHOTO-PATTERNABLE ORGANIC SEMICONDUCTOR (OSC) POLYMERS FOR ORGANIC THIN-FILM TRANSISTORS

(71) Applicant: CORNING INCORPORATED, Corning, NY (US)

(72) Inventors: Mingqian He, Horseheads, NY (US); Xin Li, Shanghai (CN); Yang Li, Shanghai (CN); Hongxiang Wang, Shanghai (CN)

(73) Assignee: CORNING INCORPORATED, Corning, NY (US)

( * ) Notice: Subject to any disclaimer, the term of this patent is extended or adjusted under 35 U.S.C. 154(b) by 804 days.

(21) Appl. No.: 17/034,552

(22) Filed: Sep. 28, 2020

(65) Prior Publication Data
US 2021/0367153 A1 Nov. 25, 2021

(30) Foreign Application Priority Data
Apr. 24, 2020 (CN) .......................... 202010332347.1

(51) Int. Cl.
*G03F 7/038* (2006.01)
*G03F 7/039* (2006.01)
(Continued)

(52) U.S. Cl.
CPC ......... *H10K 85/113* (2023.02); *C08G 61/126* (2013.01); *G03F 7/029* (2013.01); *G03F 7/039* (2013.01); *G03F 7/0388* (2013.01); *H10K 85/151* (2023.02); *C08G 2261/124* (2013.01); *C08G 2261/149* (2013.01); *C08G 2261/1414* (2013.01); *C08G 2261/18* (2013.01); *C08G 2261/228* (2013.01); *C08G 2261/3223* (2013.01); *C08G 2261/3243* (2013.01); *C08G 2261/92* (2013.01); *H10K 10/466* (2023.02); *H10K 10/484* (2023.02)

(58) Field of Classification Search
None
See application file for complete search history.

(56) References Cited

U.S. PATENT DOCUMENTS 5,847,156 A * 12/1998 Eldin .................... C08F 246/00
548/335.1
7,879,951 B2 2/2011 Lee et al.
(Continued)

FOREIGN PATENT DOCUMENTS

CN 1734350 A 2/2006
CN 101604730 A 12/2009
(Continued)

OTHER PUBLICATIONS

Wu et al., "Synthesis and characterization of photo-crosslinkable polyfluorene with acrylate side-chains", J. Appl. Polym. Sci., vol. 100 pp. 2336-2342 (2006).*
(Continued)

*Primary Examiner* — Martin J Angebrannndt
(74) *Attorney, Agent, or Firm* — Travis B. Gasa

(57) ABSTRACT

A polymer blend, including at least one organic semiconductor (OSC) polymer and at least one photosensitizer, such that the at least one OSC polymer is a diketopyrrolopyrrole-fused thiophene polymeric material, wherein the fused thiophene is beta-substituted.

22 Claims, 6 Drawing Sheets

(51) Int. Cl.
  *C08G 61/12* (2006.01)
  *H10K 10/46* (2023.01)
  *H10K 85/10* (2023.01)
  *G03F 7/029* (2006.01)

(56) References Cited

U.S. PATENT DOCUMENTS

| | | | |
|---|---|---|---|
| 8,273,460 | B2 | 9/2012 | Lee et al. |
| 2017/0192354 | A1* | 7/2017 | Zhao ............... G03F 7/0046 |
| 2021/0341838 | A1* | 11/2021 | Deng ............... G03F 7/038 |
| 2022/0155683 | A1* | 5/2022 | Deng ............... C09K 11/06 |
| 2022/0209149 | A1* | 6/2022 | He ............... H10K 85/151 |

FOREIGN PATENT DOCUMENTS

| | | | | |
|---|---|---|---|---|
| CN | 102201535 | A | | 9/2011 |
| CN | 105093723 | A | | 11/2015 |
| CN | 108191200 | A | * | 6/2018 |
| CN | 111752105 | A | | 10/2020 |
| JP | 2006238795 | A | * | 9/2006 |
| JP | 2016048361 | A | * | 4/2016 ............ B32B 27/30 |
| WO | 2020/076662 | A1 | | 4/2020 |
| WO | 2020/076882 | A1 | | 4/2020 |
| WO | 2020/197732 | A1 | | 10/2020 |

OTHER PUBLICATIONS

Bacher et al., "Photo-cross-linked triphenylenes as novel insoluble hole transport materials in organic LEDs", Macromol. vol. 32 pp. 4551-4557 (1999).*

Wang et al., "Introducing elasticity through oligo-siloxane crosslinks for intrinsically stretchable semiconductor polymers", Adv. Funct. Mater. vol. 26 pp. 725407762 (2016).*

Xiao et al., "Green light sensitive diketopyrrolopyrole derivatives used in versatile photoinitiating systems for photopolymerizations", Polym. Chem., vol. 5 pp. 2293-2300 (2014).*

Nyayachavadi et al., "Covalent cross-linking of diketopyrrolopyrrole based organogels with polydiacetylenes", Langmuir vol. 34 pp. 12126-12136 (Sep. 2018).*

Bayerl et al., "Crosslinkable hole-transport materials for the preparation of multilayer organic light emitting devices by spin coating", Macromol. Rapid. Commun., vol. 20 pp. 224-228 (1999).*

Charas et al., "Observation of Field-Effect in a Cross Linked Polyfluorene Semiconductor", Chemical Physics Letters, Issue 4-6, vol. 455, 2008, pp. 189-191.

Chinese Patent Application No. 201780027872.9, Office Action dated Apr. 16, 2021, 16 pages (5 pages of English Translation and 11 pages of Original Document), Chinese Patent Office.

Freudenberg et al., "Immobilization Strategies for Organic Semiconducting Conjugated Polymers". Chemical Reviews 2018, 118 (11), pp. 5598-5689.

Gupta et al., "In Situ Photo-Cross-Linking of Cinnamate Functionalized Poly(methyl methacrylate-co-2-hydroxyethyl acrylate) Fibers during Electrospinning". Macromolecules 2004, 37, 9211.

Jang et al, "Direct photo-patternable, low-temperature processable polyimide gate insulator for pentacene thin-film transistor". Organic Electronics 2012, 13, pp. 1665-16670.

Kawatsuki et al., "Photoreaction of Photo-cross-linkable Methacrylate Polymer Films Comprising 2-Cinnamoyloxyethoxybiphenyl Side Group by Linearly Polarized Ultraviolet Light and Liquid Crystal Alignment on the Resultant Films". Chem. Mater. 2000, 12, 1549.

Kim et al.., "Photocurable propyl-cinnamate-functionalized polyhedral oligomeric silsesquioxane as a gate dielectric for organic thin film transistors". Organic Electronics 2013, 14 (9), 2315-2323.

Lee et al., "Novel photo-alignment polymer layer capable of charge transport", Macromolecular Chemistry and Physics 2004, 205 (16), 2245-2251.

Liu et al., "Synthesis and characterization of polyphosphazene with coumarin as side group", 2005.

Maddipatla et al, "Photoresponsive coumarin polyesters that exhibit cross-linking and chain scission properties". Macromolecules 2013, 46 (13), 5133-5140.

Qiu et al., "Organic thin-film transistors with a photo-patternable semiconducting polymer blend". Journal of Materials Chemistry 2011, 21 (39), 15637-15642.

Remmers et al., "Photo-cross-linkable poly(p-phenylene)s. Synthesis, Langmuir-Blodgett multilayer film properties and pattern formation", Macromolecular Chemistry and Physics 1997, 198 (8), 2551-2561.

Schelkle et al., "Photo-Cross-Linkable Polymeric Optoelectronics Based on the [2+2] Cycloaddition Reaction of Cinnamic Acid". Macromolecules 2016, 49 (5), 1518-1522.

Shih, H. K.; Chen, Y. H.; Chu, Y. L.; Cheng, C. C.; Chang, F. C.; Zhu, C. Y.; Kuo, S. W., Photo-crosslinking of pendent uracil units provides supramolecular hole injection/transport conducting polymers for highly efficient light-emitting diodes. Polymers 2015, 7 (5), 804-818.

Sonoda, Y., Solid-state [2+2] photodimerization and photopolymerization of a,?-diarylpolyene monomers: Effective utilization of noncovalent intermolecular interactions in crystals. Molecules 2011, 16 (1), 119-148.

Tsai et al., "Luminescent poly(p-phenylenevinylene) with 4-methylcoumarin side groups: Synthesis, optical properties and photo-crosslinking behaviors". Reactive and Functional Polymers 2006, 66 (11), pp. 1327-1335.

* cited by examiner

FIG. 1A
FIG. 1B
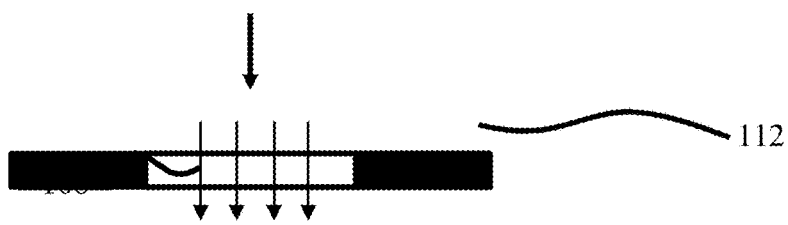
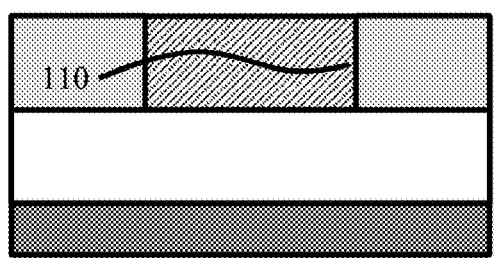
FIG. 1C
FIG. 1D
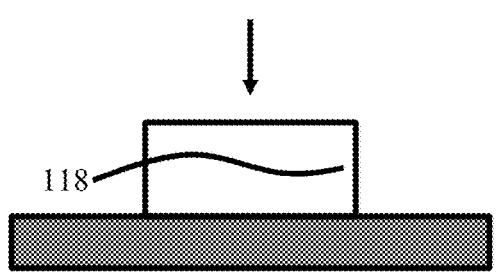
FIG. 1E

PHOTO-PATTERNABLE ORGANIC SEMICONDUCTOR (OSC) POLYMERS FOR ORGANIC THIN-FILM TRANSISTORS

BACKGROUND

1. Cross-Reference to Related Applications

This application claims the benefit of priority under 35 U.S.C. § 119 of Chinese Patent Application Serial No. 202010332347.1 filed on Apr. 24, 2020, the content of which is relied upon and incorporated herein by reference in its entirety.

2. Field

This disclosure relates to photo-patternable organic semiconductor (OSC) polymers as semiconducting layers for organic thin-film transistors (OTFTs).

3. Technical Background

Organic thin-film transistors (OTFTs) have garnered extensive attention as alternatives to conventional silicon-based technologies, which require high temperature and high vacuum deposition processes, as well as complex photolithographic patterning methods. Semiconducting (i.e., organic semiconductor, OSC) layers are one important component of OTFTs which can effectively influence the performance of devices.

Traditional technologies in the manufacture of inorganic TFT device arrays often rely on photolithography as the patterning process. However, photolithography usually involves harsh oxygen ($O_2$) plasma during pattern transfer or photoresist removal and aggressive developing solvents which may severely damage the OSC layer and lead to significant deterioration of device performance.

This disclosure presents improved photo-patternable organic semiconductor polymers and use thereof for OSC layers of organic thin-film transistors.

SUMMARY

In some embodiments, a polymer blend, comprises: at least one organic semiconductor (OSC) polymer and at least one photosensitizer, wherein the at least one OSC polymer is a diketopyrrolopyrrole-fused thiophene polymeric material, wherein the fused thiophene is beta-substituted.

In one aspect, which is combinable with any of the other aspects or embodiments, the at least one OSC polymer comprises a first portion and a second portion, wherein at least one of the first portion or the second portion comprises at least one UV-curable side chain.

In one aspect, which is combinable with any of the other aspects or embodiments, the at least one UV-curable side chain comprises at least one of acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, the at least one UV-curable side chain comprises at least one of chalones, cinnamates, coumarins, or combinations thereof.

In one aspect, which is combinable with any of the other aspects or embodiments, the polymer blend further comprises: at least one crosslinker, wherein the at least one crosslinker comprises at least one of acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, the polymer blend further comprises: at least one crosslinker, wherein the at least one crosslinker comprises at least one of chalones, cinnamates, coumarins, or combinations thereof.

In one aspect, which is combinable with any of the other aspects or embodiments, the polymer blend further comprises: at least one crosslinker selected from:

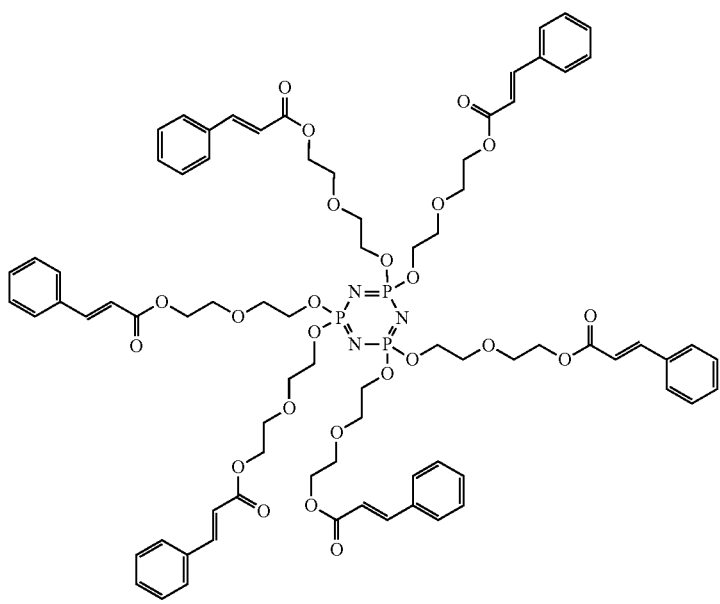

C1

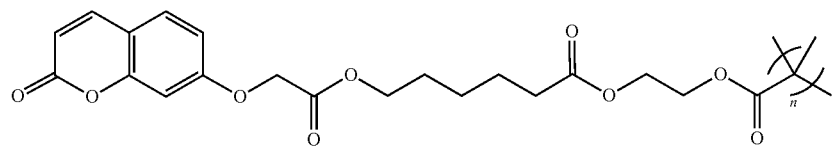
C2
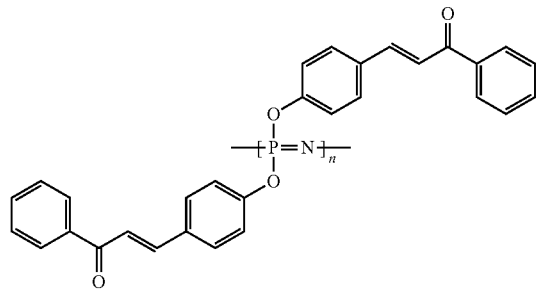
C4
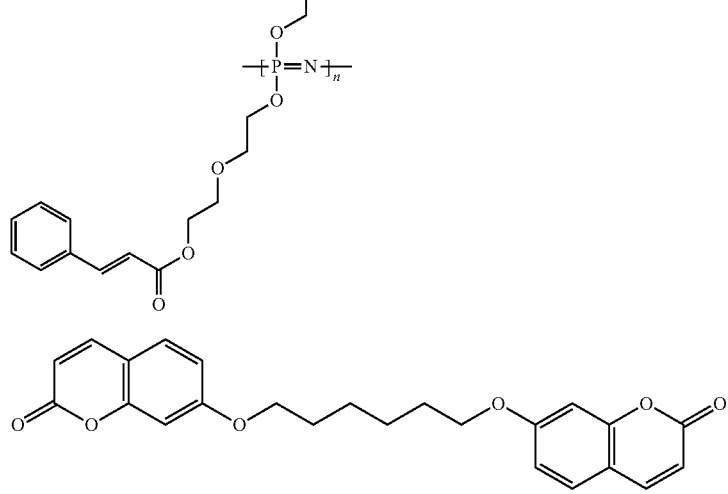
C3
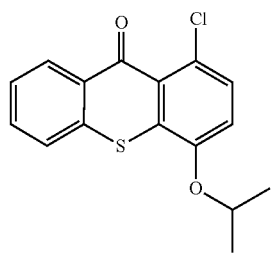
C5
or combinations thereof.
In one aspect, which is combinable with any of the other aspects or embodiments, the at least one photosensitizer is selected from:
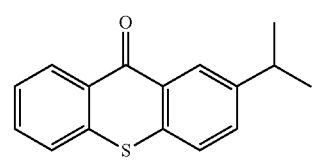
P1
-continued
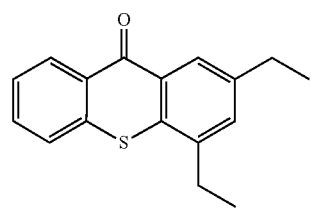
P3
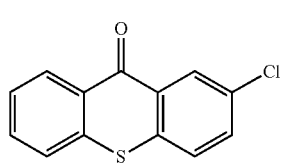
P2
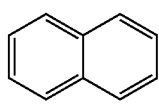
P4
P5

-continued

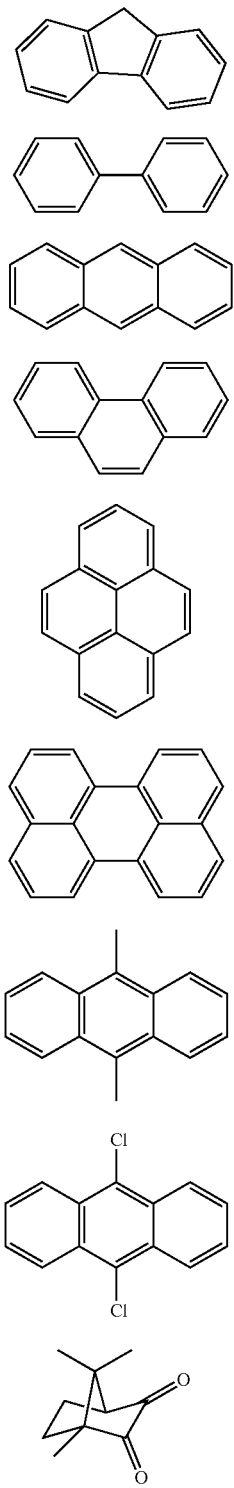

or combinations thereof.

In one aspect, which is combinable with any of the other aspects or embodiments, the polymer blend further comprises: at least one of antioxidants, lubricants, compatibilizers, leveling agents, or nucleating agents present in a range of 0.05 wt. % to 5 wt. %. In one aspect, which is combinable with any of the other aspects or embodiments, the at least one OSC polymer comprises the repeat unit of Formula 1 or Formula 2, or a salt, isomer, or analog thereof:

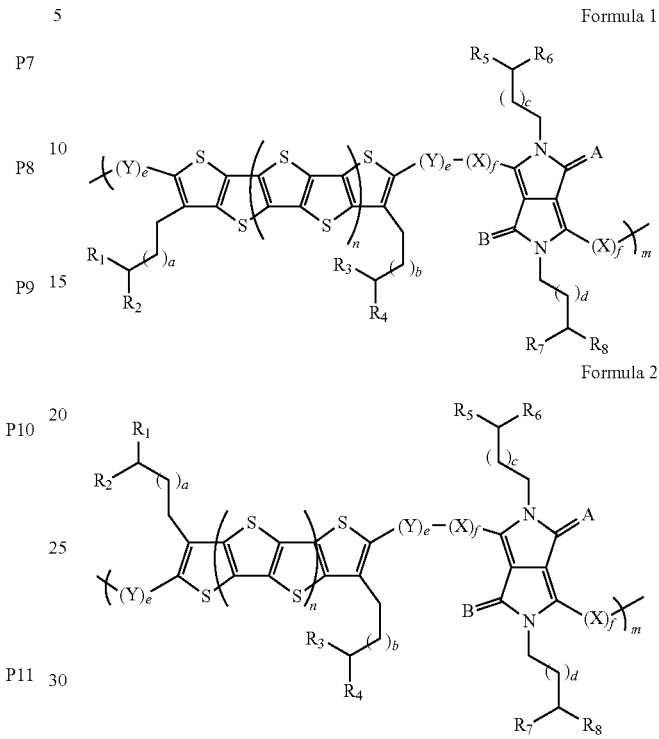

Formula 1

Formula 2 wherein in Formula 1 and Formula 2: m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_4$ are hydrogen; (iii) if any of $R_5$, $R_6$, $R_7$, or $R_8$ is hydrogen, then none of $R_1$, $R_2$, $R_3$, or $R_4$ are hydrogen; (iv) e and f cannot both be 0; (v) if either e or f is 0, then c and d, independently, are integers greater than or equal to 5; and (vi) the polymer having a molecular weight, wherein the molecular weight of the polymer is greater than 10,000.

In one aspect, which is combinable with any of the other aspects or embodiments, for the first portion, $R_5$ and $R_7$ are hydrogen and $R_6$ and $R_8$ are substituted or unsubstituted $C_4$ or greater alkenyl.

In one aspect, which is combinable with any of the other aspects or embodiments, for the first portion and the second portion, $R_5$ and $R_7$ are hydrogen and $R_6$ and $R_8$ are substituted or unsubstituted $C_4$ or greater alkenyl.

In one aspect, which is combinable with any of the other aspects or embodiments, at least one of $R_5$, $R_6$, $R_7$, and $R_8$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, at least one of $R_5$, $R_6$, $R_7$, and $R_8$ comprise chalones, cinnamates, coumarins, or combinations thereof.

In one aspect, which is combinable with any of the other aspects or embodiments, at least one of $R_1$, $R_2$, $R_3$, and $R_4$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, at least one of $R_1$, $R_2$, $R_3$, and $R_4$ comprise chalones, cinnamates, coumarins, or combinations thereof.

In some embodiments, a polymer blend, comprises: at least one organic semiconductor (OSC) polymer and at least one photosensitizer, wherein the at least one OSC polymer comprises a structure of Formula 7:

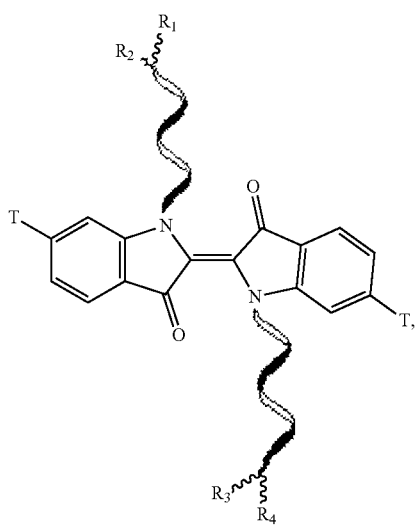

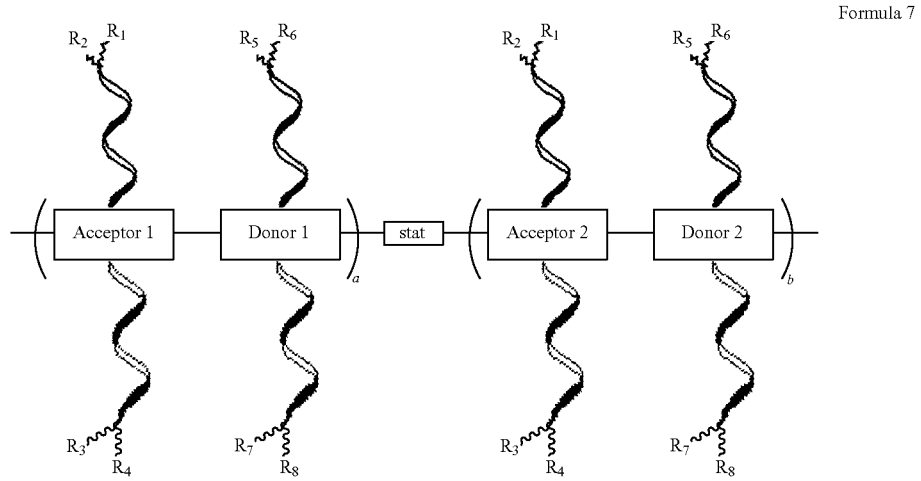

Formula 7 wherein in Formula 7: Acceptor 1 and Acceptor 2 are each electron withdrawing groups; Donor 1 and Donor 2 are electron-donating groups; a and b are, independently, integers greater than or equal to one; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl, wherein: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) one of $R_1$ or $R_2$ and one of $R_3$ or $R_4$ are, independently, connected with Acceptor 1 and Acceptor 2; (v) one of $R_5$ or $R_6$ and one of $R_7$ or $R_8$ are, independently, connected with Donor 1 and Donor 2; and (vi) the at least one OSC polymer has a molecular weight of greater than 10,000.

In one aspect, which is combinable with any of the other aspects or embodiments, Acceptor 1 and Acceptor 2 are independently selected from the group comprising:

-continued

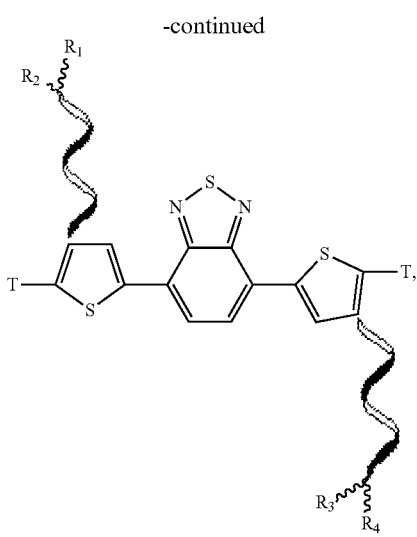

-continued

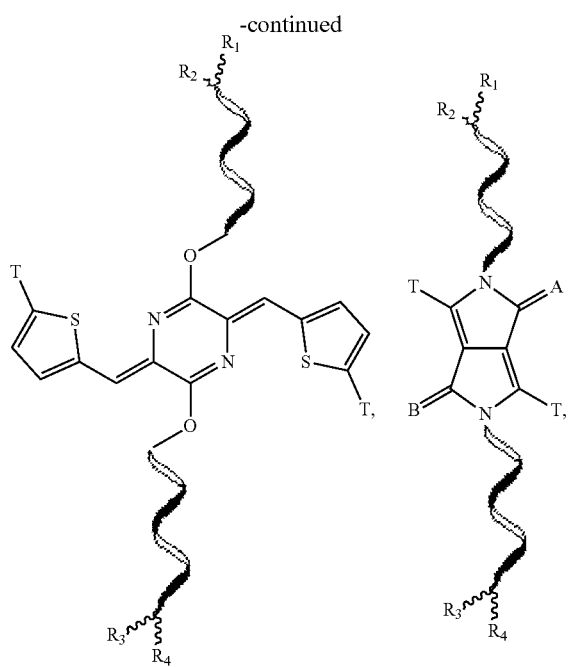

wherein A and B may be, independently, either S or O, and T is a connection terminus to at least one of Donor 1 or Donor 2.

In one aspect, which is combinable with any of the other aspects or embodiments, Donor 1 and Donor 2 are independently selected from the group comprising: thiophene, benzene, fused thiophene, or combinations thereof.

In one aspect, which is combinable with any of the other aspects or embodiments, at least one of $R_5$, $R_6$, $R_7$, and $R_8$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, at least one of $R_1$, $R_2$, $R_3$, and $R_4$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In some embodiments, a polymer blend, comprises: at least one coumarin-based organic semiconductor (OSC) polymer and at least one photosensitizer, wherein the at least one coumarin-based OSC polymer includes a diketopyrrolopyrrole-fused thiophene polymeric material, wherein the fused thiophene is beta-substituted.

BRIEF DESCRIPTION OF THE DRAWINGS

The disclosure will become more fully understood from the following detailed description, taken in conjunction with the accompanying figures, in which:

FIGS. 1A to 1E illustrate traditional patterning techniques of organic semiconductor materials utilizing photoresists.

DETAILED DESCRIPTION

Figure 2A:
FIGS. 2A to 2C illustrate patterning techniques of organic semiconductor materials, according to some embodiments.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments. It should be understood that the present application is not limited to the details or methodology set forth in the description or illustrated in the figures. It should also be understood that the terminology is for the purpose of description only and should not be regarded as limiting.

Additionally, any examples set forth in this specification are illustrative, but not limiting, and merely set forth some of the many possible embodiments of the claimed invention. Other suitable modifications and adaptations of the variety of conditions and parameters normally encountered in the field, and which would be apparent to those skilled in the art, are within the spirit and scope of the disclosure.

Definitions

The term 'cinnamate' refers to a salt or ester of cinnamic acid, which is an organic compound with the formulate $C_6H_5CH\!=\!\!CHCOOH$. Both cinnamic acids and cinnamates are classified as unsaturated carboxylic acids. Cinnamates may occur as both cis and trans isomers.

The term 'chalcone' refers to an aromatic ketone and an enone that forms the central core for a variety of important biological compounds, collectively as chalcones or chalconoids. Examples of chalcones include benzylideneacetophenone, phenyl styryl ketone, benzalacetophenone, β-phenylacrylophenone, γ-oxo-α,γ-diphenyl-α-propylene, and α-phenyl-β-benzoylethylene.

The term 'coumarin' (i.e., 2H-chromen-2-one) refers to an aromatic organic chemical compound with formula $C_9H_6O_2$. It is a benzene molecule with two adjacent hydrogen atoms replaced by a lactone-like chain —O—, forming a second six-membered heterocycle that shares two carbons with the benzene ring. It may be placed in the benzopyrone chemical class and considered as a lactone.

The term 'arylalkene' refers to an alkene group that is directly bonded to an aromatic group.

The term "alkyl group" refers to a monoradical branched or unbranched saturated hydrocarbon chain having 1 to 40 carbon atoms. This term is exemplified by groups such as methyl, ethyl, n-propyl, isopropyl, n-butyl, isobutyl, t-butyl, pentyl, n-hexyl, n-heptyl, n-octyl, n-decyl, or tetradecyl, and the like. The alkyl group can be substituted or unsubstituted.

The term "substituted alkyl group" refers to: (1) an alkyl group as defined above, having 1, 2, 3, 4 or 5 substituents, typically 1 to 3 substituents, selected from the group consisting of alkenyl, alkynyl, alkoxy, aralkyl, aldehyde, cycloalkyl, cycloalkenyl, acyl, acylamino, acyl halide, acyloxy, amino, aminocarbonyl, alkoxycarbonylamino, azido, cyano, halogen, hydroxy, keto, thiocarbonyl, carboxy, carboxyalkyl, arylthiol, ester, heteroarylthio, heterocyclylthio, hydroxyl, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl and —SO$_2$— heteroaryl, thioalkyl, vinyl ether. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2; or (2) an alkyl group as defined above that is interrupted by 1-10 atoms independently chosen from oxygen, sulfur and NR$_a$, where R$_a$ is chosen from hydrogen, alkyl, cycloalkyl, alkenyl, cycloalkenyl, alkynyl, aryl, heteroaryl and heterocyclyl. All substituents may be optionally further substituted by alkyl, alkoxy, halogen, CF$_3$, amino, substituted amino, cyano, or —S(O)$_n$R$_{SO}$, in which R$_{SO}$ is alkyl, aryl, or heteroaryl and n is 0, 1 or 2; or (3) an alkyl group as defined above that has both 1, 2, 3, 4 or 5 substituents as defined above and is also interrupted by 1-10 atoms as defined above. For example, the alkyl groups can be an alkyl hydroxy group, where any of the hydrogen atoms of the alkyl group are substituted with a hydroxyl group.

The term "alkyl group" as defined herein also includes cycloalkyl groups. The term "cycloalkyl group" as used herein is a non-aromatic carbon-based ring (i.e., carbocyclic) composed of at least three carbon atoms, and in some embodiments from three to 20 carbon atoms, having a single cyclic ring or multiple condensed rings. Examples of single ring cycloalkyl groups include, but are not limited to, cyclopropyl, cyclobutyl, cyclopentyl, cyclohexyl, cyclooctyl, and the like. Examples of multiple ring cycloalkyl groups include, but are not limited to, adamantanyl, bicyclo [2.2.1]heptane, 1,3,3-trimethylbicyclo[2.2.1]hept-2-yl, (2,3,3-trimethylbicyclo[2.2.1]hept-2-yl), or carbocyclic groups to which is fused an aryl group, for example indane, and the like. The term cycloalkyl group also includes a heterocycloalkyl group, where at least one of the carbon atoms of the ring is substituted with a heteroatom such as, but not limited to, nitrogen, oxygen, sulfur, or phosphorus.

The term "unsubstituted alkyl group" is defined herein as an alkyl group composed of just carbon and hydrogen.

The term "acyl" denotes a group —C(O)R$_{CO}$, in which R$_{CO}$ is hydrogen, optionally substituted alkyl, optionally substituted cycloalkyl, optionally substituted heterocyclyl, optionally substituted aryl, and optionally substituted heteroaryl.

The term "aryl group" as used herein is any carbon-based aromatic group (i.e., aromatic carbocyclic) such as having a single ring (e.g., phenyl) or multiple rings (e.g., biphenyl), or multiple condensed (fused) rings (e.g., naphthyl or anthryl). These may include, but are not limited to, benzene, naphthalene, phenyl, etc.

The term "aryl group" also includes "heteroaryl group," meaning a radical derived from an aromatic cyclic group (i.e., fully unsaturated) having 1, 2, 3, 4, 5, 6, 7, 8, 9, 10, 11, 12, 13, 14, or 15 carbon atoms and 1, 2, 3 or 4 heteroatoms selected from oxygen, nitrogen, sulfur, and phosphorus within at least one ring. In other words, heteroaryl groups are aromatic rings composed of at least three carbon atoms that has at least one heteroatom incorporated within the ring of the aromatic group. Such heteroaryl groups can have a single ring (e.g., pyridyl or furyl) or multiple condensed rings (e.g., indolizinyl, benzothiazolyl, or benzothienyl). Examples of heteroaryls include, but are not limited to, [1,2,4]oxadiazole, [1,3,4]oxadiazole, [1,2,4]thiadiazole, [1,3,4]thiadiazole, pyrrole, imidazole, pyrazole, pyridine, pyrazine, pyrimidine, pyridazine, indolizine, isoindole, indole, indazole, purine, quinolizine, isoquinoline, quinoline, phthalazine, naphthylpyridine, quinoxaline, quinazoline, cinnoline, pteridine, carbazole, carboline, phenanthridine, acridine, phenanthroline, isothiazole, phenazine, isoxazole, phenoxazine, phenothiazine, imidazolidine, imidazoline, triazole, oxazole, thiazole, naphthyridine, and the like as well as N-oxide and N-alkoxy derivatives of nitrogen containing heteroaryl compounds, for example pyridine-N-oxide derivatives.

Unless otherwise constrained by the definition for the heteroaryl substituent, such heteroaryl groups can be optionally substituted with 1 to 5 substituents, typically 1 to 3 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$— heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The aryl group can be substituted or unsubstituted. Unless otherwise constrained by the definition for the aryl substituent, such aryl groups can optionally be substituted with from 1 to 5 substituents, typically 1 to 3 substituents, selected from the group consisting of alkyl, alkenyl, alkynyl, alkoxy, aldehyde, cycloalkyl, cycloalkenyl, acyl, acylamino, acyloxy, amino, aminocarbonyl, alkoxycarbonylamino, azido, cyano, ester, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO— heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2. In some embodiments, the term "aryl group" is limited to substituted or unsubstituted aryl and heteroaryl rings having from three to 30 carbon atoms.

The term "aralkyl group" as used herein is an aryl group having an alkyl group or an alkylene group as defined herein covalently attached to the aryl group. An example of an aralkyl group is a benzyl group. "Optionally substituted aralkyl" refers to an optionally substituted aryl group covalently linked to an optionally substituted alkyl group or alkylene group. Such aralkyl groups are exemplified by benzyl, phenylethyl, 3-(4-methoxyphenyl)propyl, and the like.

The term "heteroaralkyl" refers to a heteroaryl group covalently linked to an alkylene group, where heteroaryl and alkylene are defined herein. "Optionally substituted heteroaralkyl" refers to an optionally substituted heteroaryl group covalently linked to an optionally substituted alkylene group. Such heteroaralkyl groups are exemplified by 3-pyridylmethyl, quinolin-8-ylethyl, 4-methoxythiazol-2-ylpropyl, and the like.

The term "alkenyl group" refers to a monoradical of a branched or unbranched unsaturated hydrocarbon group typically having from 2 to 40 carbon atoms, more typically 2 to 10 carbon atoms and even more typically 2 to 6 carbon atoms and having 1-6, typically 1, double bond (vinyl). Typical alkenyl groups include ethenyl or vinyl (—CH=CH$_2$), 1-propylene or allyl (—CH$_2$CH=CH$_2$), isopropylene (—C(CH$_3$)=CH$_2$), bicyclo[2.2.1]heptene, and the like. When alkenyl is attached to nitrogen, the double bond cannot be alpha to the nitrogen.

The term "substituted alkenyl group" refers to an alkenyl group as defined above having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "cycloalkenyl group" refers to carbocyclic groups of from 3 to 20 carbon atoms having a single cyclic ring or multiple condensed rings with at least one double bond in the ring structure.

The term "alkynyl group" refers to a monoradical of an unsaturated hydrocarbon, typically having from 2 to 40 carbon atoms, more typically 2 to 10 carbon atoms and even more typically 2 to 6 carbon atoms and having at least 1 and typically from 1-6 sites of acetylene (triple bond) unsaturation. Typical alkynyl groups include ethynyl, (—C≡CH), propargyl (or prop-1-yn-3-yl, —CH$_2$C≡CH), and the like. When alkynyl is attached to nitrogen, the triple bond cannot be alpha to the nitrogen.

The term "substituted alkynyl group" refers to an alkynyl group as defined above having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO— heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "alkylene group" is defined as a diradical of a branched or unbranched saturated hydrocarbon chain, having 1, 2, 3, 4, 5, 6, 7, 8, 9, 10, 11, 12, 13, 14, 15, 16, 17, 18, 19 or 20 carbon atoms, typically 1-10 carbon atoms, more typically 1, 2, 3, 4, 5 or 6 carbon atoms. This term is exemplified by groups such as methylene (—CH$_2$—), ethylene (—CH$_2$CH$_2$—), the propylene isomers (e.g., —CH$_2$CH$_2$CH$_2$— and —CH(CH$_3$)CH$_2$—) and the like.

The term "substituted alkylene group" refers to: (1) an alkylene group as defined above having 1, 2, 3, 4, or 5 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2; or (2) an alkylene group as defined above that is interrupted by 1-20 atoms independently chosen from oxygen, sulfur and NR$_a$—, where R$_a$ is chosen from hydrogen, optionally substituted alkyl, cycloalkyl, cycloalkenyl, aryl, heteroaryl and heterocyclyl, or groups selected from carbonyl, carboxyester, carboxyamide and sulfonyl; or (3) an alkylene group as defined above that has both 1, 2, 3, 4 or 5 substituents as defined above and is also interrupted by 1-20 atoms as defined above. Examples of substituted alkylenes are chloromethylene (—CH(Cl)—), aminoethylene (—CH(NH$_2$)CH$_2$—), methylaminoethylene (—CH(NHMe)CH$_2$—), 2-carboxypropylene isomers (—CH$_2$CH(CO$_2$H)CH$_2$—), ethoxyethyl (—CH$_2$CH$_2$O—CH$_2$CH$_2$—), ethylmethylaminoethyl (—CH$_2$CH$_2$N(CH$_3$)CH$_2$CH$_2$—), and the like.

The term "alkoxy group" refers to the group R—O—, where R is an optionally substituted alkyl or optionally substituted cycloalkyl, or R is a group —Y—Z, in which Y is optionally substituted alkylene and Z is optionally substituted alkenyl, optionally substituted alkynyl; or optionally substituted cycloalkenyl, where alkyl, alkenyl, alkynyl, cycloalkyl and cycloalkenyl are as defined herein. Typical alkoxy groups are optionally substituted alkyl-O— and include, by way of example, methoxy, ethoxy, n-propoxy, iso-propoxy, n-butoxy, tert-butoxy, sec-butoxy, n-pentoxy, n-hexoxy, 1,2-dimethylbutoxy, trifluoromethoxy, and the like.

The term "alkylthio group" refers to the group R$_S$—S—, where R$_S$ is as defined for alkoxy.

The term "aminocarbonyl" refers to the group —C(O)NR$_N$R$_N$ where each R$_N$ is independently hydrogen, alkyl, aryl, heteroaryl, heterocyclyl or where both R$_N$ groups are joined to form a heterocyclic group (e.g., morpholino). Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "acylamino" refers to the group —NR$_{NCO}$C(O)R where each R$_{NCO}$ is independently hydrogen, alkyl, aryl, heteroaryl, or heterocyclyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "acyloxy" refers to the groups —O(O)C-alkyl, —O(O)C-cycloalkyl, —O(O)C-aryl, —O(O)C-heteroaryl, and —O(O)C-heterocyclyl. Unless otherwise constrained by the definition, all substituents may be optionally further substituted by alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "aryloxy group" refers to the group aryl-O— wherein the aryl group is as defined above, and includes optionally substituted aryl groups as also defined above.

The term "heteroaryloxy" refers to the group heteroaryl-O—.

The term "amino" refers to the group —NH$_2$.

The term "substituted amino" refers to the group —NR$_w$R$_w$ where each R$_w$ is independently selected from the group consisting of hydrogen, alkyl, cycloalkyl, carboxyalkyl (for example, benzyloxycarbonyl), aryl, heteroaryl and heterocyclyl provided that both R$_w$ groups are not hydrogen, or a group —Y—Z, in which Y is optionally substituted alkylene and Z is alkenyl, cycloalkenyl, or alkynyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "carboxy" refers to a group —C(O)OH. The term "carboxyalkyl group" refers to the groups —C(O)O-alkyl or —C(O)O-cycloalkyl, where alkyl and cycloalkyl, are as defined herein, and may be optionally further substituted by alkyl, alkenyl, alkynyl, alkoxy, halogen, CF$_3$, amino, substituted amino, cyano, and —S(O)$_n$R$_{SO}$, in which R$_{SO}$ is alkyl, aryl, or heteroaryl and n is 0, 1 or 2.

The terms "substituted cycloalkyl group" or "substituted cycloalkenyl group" refer to cycloalkyl or cycloalkenyl groups having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "conjugated group" is defined as a linear, branched or cyclic group, or combination thereof, in which p-orbitals of the atoms within the group are connected via delocalization of electrons and wherein the structure can be described as containing alternating single and double or triple bonds and may further contain lone pairs, radicals, or carbenium ions. Conjugated cyclic groups may comprise both aromatic and non-aromatic groups, and may comprise polycyclic or heterocyclic groups, such as diketopyrrolopyrrole. Ideally, conjugated groups are bound in such a way as to continue the conjugation between the thiophene moieties they connect. In some embodiments, "conjugated groups" is limited to conjugated groups having three to 30 carbon atoms.

The term "halogen," "halo," or "halide" may be referred to interchangeably and refer to fluoro, bromo, chloro, and iodo.

The term "heterocyclyl" refers to a monoradical saturated or partially unsaturated group having a single ring or multiple condensed rings, having from 1 to 40 carbon atoms and from 1 to 10 hetero atoms, typically 1, 2, 3 or 4 heteroatoms, selected from nitrogen, sulfur, phosphorus, and/or oxygen within the ring. Heterocyclic groups can have a single ring or multiple condensed rings, and include tetrahydrofuranyl, morpholino, piperidinyl, piperazino, dihydropyridino, and the like.

Unless otherwise constrained by the definition for the heterocyclyl substituent, such heterocyclyl groups can be optionally substituted with 1, 2, 3, 4 or 5, and typically 1, 2 or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, —SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "thiol" refers to the group —SH. The term "substituted alkylthio" refers to the group —S-substituted alkyl. The term "arylthiol group" refers to the group aryl-S—, where aryl is as defined as above. The term "heteroarylthiol" refers to the group —S-heteroaryl wherein the heteroaryl group is as defined above including optionally substituted heteroaryl groups as also defined above.

The term "sulfoxide" refers to a group —S(O)R$_{SO}$, in which R$_{SO}$ is alkyl, aryl, or heteroaryl. The term "substituted sulfoxide" refers to a group —S(O)R$_{SO}$, in which R$_{SO}$ is substituted alkyl, substituted aryl, or substituted heteroaryl, as defined herein. The term "sulfone" refers to a group —S(O)$_2$R$_{SO}$, in which R$_{SO}$ is alkyl, aryl, or heteroaryl. The term "substituted sulfone" refers to a group —S(O)$_2$R$_{SO}$, in which R$_{SO}$ is substituted alkyl, substituted aryl, or substituted heteroaryl, as defined herein.

The term "keto" refers to a group —C(O)—. The term "thiocarbonyl" refers to a group —C(S)—.

As used herein, the term "room temperature" is 20° C. to 25° C.

Disclosed are compounds, compositions, and components that can be used for, can be used in conjunction with, can be used in preparation of, or are products of the disclosed methods and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of molecules A, B, and C are disclosed as well as a class of molecules D, E, and F and an example of a combination molecule, A-D is disclosed, then even if each is not individually recited, each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

A weight percent of a component, unless specifically stated to the contrary, is based on the total weight of the formulation or composition in which the component is included.

Organic semiconductors as functional materials may be used in a variety of applications including, for example, printed electronics, organic transistors, including organic thin-film transistors (OTFTs) and organic field-effect transistors (OFETs), organic light-emitting diodes (OLEDs), organic integrated circuits, organic solar cells, and disposable sensors. Organic transistors may be used in many applications, including smart cards, security tags, and the backplanes of flat panel displays. Organic semiconductors may substantially reduce cost compared to inorganic counterparts, such as silicon. Depositing OSCs from solution may enable fast, large-area fabrication routes such as various printing methods and roll-to-roll processes.

Organic thin-film transistors are particularly interesting because their fabrication processes are less complex as compared with conventional silicon-based technologies. For example, OTFTs generally rely on low temperature deposition and solution processing, which, when used with semiconducting conjugated polymers, can achieve valuable technological attributes, such as compatibility with simple-write printing techniques, general low-cost manufacturing approaches, and flexible plastic substrates. Other potential applications for OTFTs include flexible electronic papers, sensors, memory devices (e.g., radio frequency identification cards (RFIDs)), remote controllable smart tags for supply chain management, large-area flexible displays, and smart cards.

Organic Semiconductor (OSC) Polymer

An OSC polymer may be used to produce organic semiconductor devices. In some examples, a polymer blend comprises an organic semiconductor polymer. In some examples, the OSC polymer has a main backbone that is fully conjugated. In some examples, the OSC is a diketopyrrolopyrrole (DPP) fused thiophene polymeric material. In some examples, the fused thiophene is beta-substituted. This OSC may contain both fused thiophene and diketopyrrolopyrrole units. In some examples, the OSC is used in OTFT applications. For example, the OSC polymer may comprise the repeat unit of Formula 1 or Formula 2, or a salt, isomer, or analog thereof:

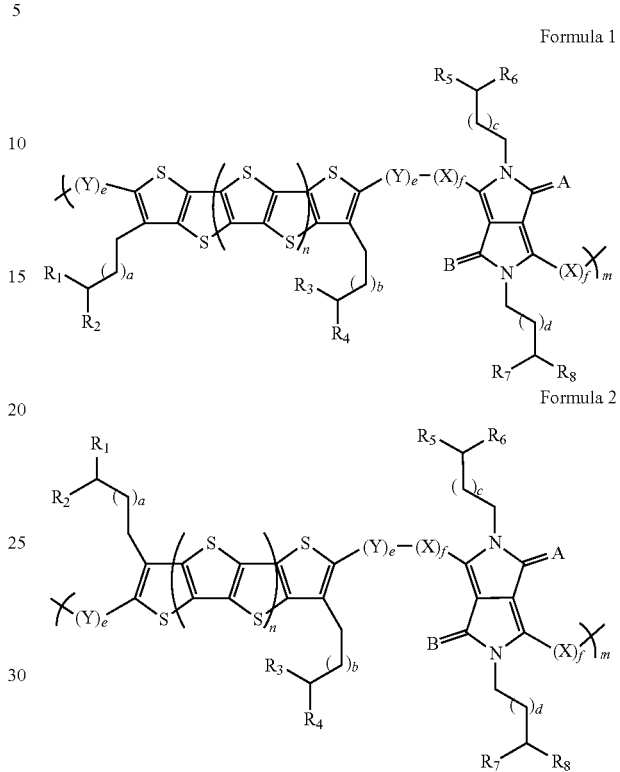

Formula 1

Formula 2 wherein in Formula 1 and Formula 2: m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) e and f cannot both be 0; (v) if either e or f is 0, then c and d, independently, are integers greater than or equal to 5; and (iv) the polymer having a molecular weight, wherein the molecular weight of the polymer is greater than 10,000.

In some embodiments, the OSC polymers defined in Formula 1 or Formula 2 enable simple transistor fabrication at relatively low temperatures, which is particularly important for the realization of large-area, mechanically flexible electronics. A beta-substituted OSC polymer can also help to improve solubility.

In some examples, the OSC polymer may comprise a first portion and a second portion, such that at least one of the first portion or the second portion comprises at least one UV-curable side chain. In some examples, the at least one UV-curable side chain comprises at least one of acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof. In some examples, only the first portion comprises the at least one UV-curable side chain. In some examples, only the second portion comprises the at least one UV-curable side chain. In some examples, both the first portion and the second portion comprise the at least one UV-curable side chain.

In some examples, such as when the first portion comprises the at least one UV-curable side chain, the second portion comprises a repeat unit of Formulas 3-6, or a salt, isomer, or analog thereof. In some examples, such as when the second portion comprises the at least one UV-curable side chain, the first portion comprises a repeat unit of Formulas 3-6, or a salt, isomer, or analog thereof. In some examples, $R_5$ and $R_7$ are hydrogen and $R_6$ and $R_8$ are substituted or unsubstituted $C_4$ or greater alkenyl in the first portion and the second portion comprises a repeat unit of Formulas 3-6, or a salt, isomer, or analog thereof. In some examples, $R_5$ and $R_7$ are hydrogen and $R_6$ and $R_8$ are substituted or unsubstituted $C_4$ or greater alkenyl in the first portion and the second portion. In some examples, at least one of $R_5$, $R_6$, $R_7$, and $R_8$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof. In some examples, at least one of $R_1$, $R_2$, $R_3$, and $R_4$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

Formula 3

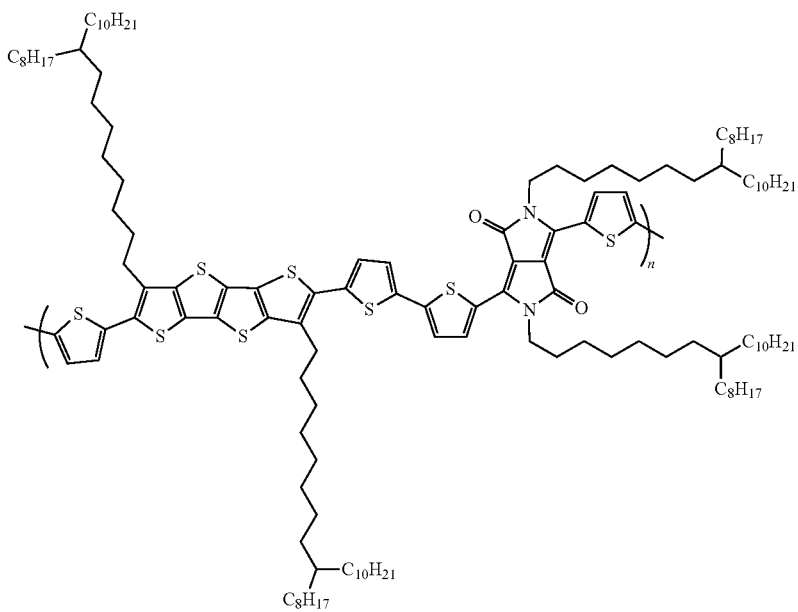

Formula 4

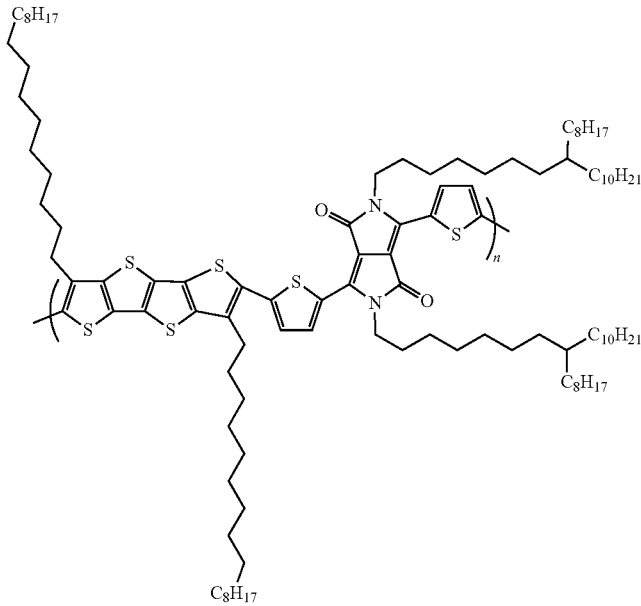

-continued

Formula 5

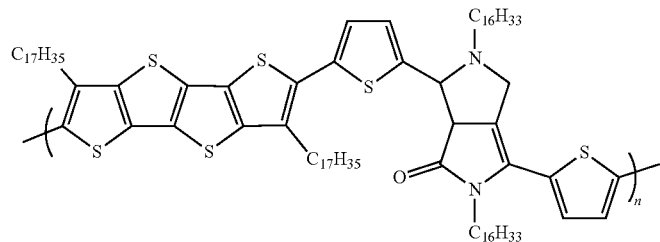

Formula 6

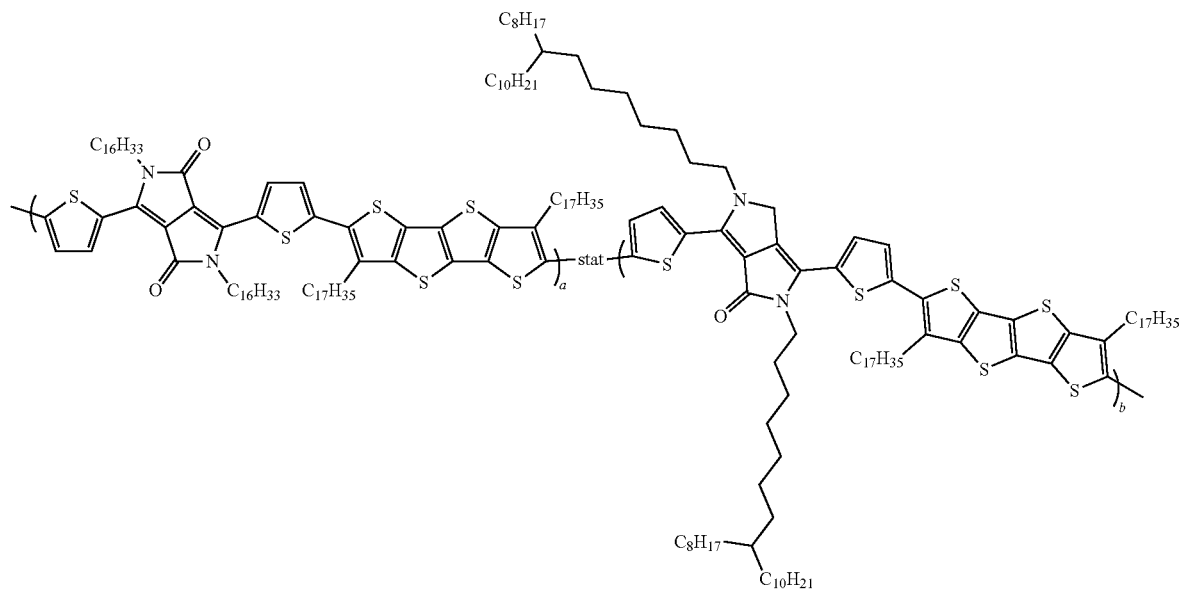

In some examples, the at least one UV-curable side chain comprises at least one alkyl chain terminated by a functional group which can be UV crosslinked by a [2+2]/[4+2] mechanism (e.g., cinnamates, coumarins and chalcones).

In some examples, the OSC polymer may comprise a structure of Formula 7:

and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl, and wherein: (i) at least one of $R_1$ or $R_2$; one of $R_3$ or $R_4$; one of $R_5$ or $R_6$; and one of $R_7$ or $R_8$ is a substituted or unsubstituted alkyl, Formula 7

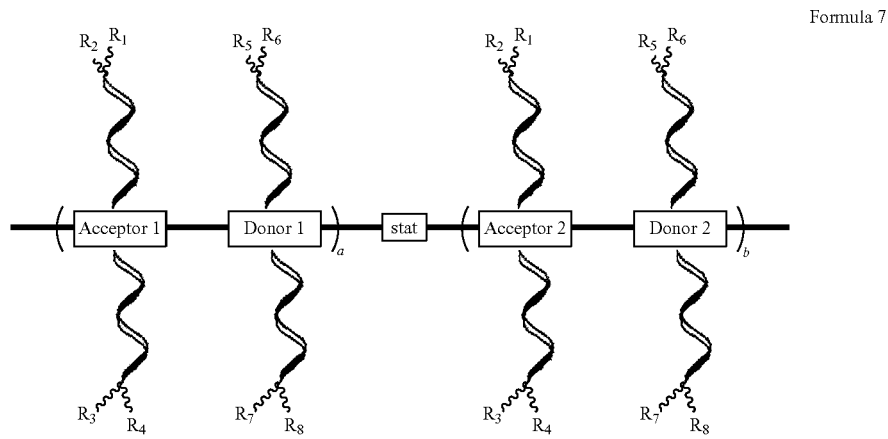

wherein in Formula 7 Acceptor 1 and Acceptor 2 are each electron withdrawing groups; ' ' Donor 1 and Donor 2 are electron donating groups; a and b are, independently, integers greater than or equal to one; $R_1$, $R_2$, $R_3$, $R_4$, $R_5$, $R_6$, $R_7$, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) one of $R_1$ or $R_2$ and one of $R_3$ or $R_4$ are, independently, connected with Acceptor 1 and Acceptor 2; (v) one of $R_5$ or $R_6$ and one of $R_7$ or $R_8$ are, independently, connected with Donor 1 and Donor 2; and (vi) the at least one OSC polymer has a molecular weight of greater than 10,000. Electron donating groups are functional groups that donate a portion of their electron density into a conjugated π-system via resonance or inductive effects, thereby making the π-system more nucleophilic. Electron withdrawing groups have an opposite effect on nucleophilicity as an electron donating group, as it removes electron density from a π-system, making the π-system less nucleophilic.

In some examples, $R_1$ and $R_3$ are connected with Acceptor 1 and/or Acceptor 2. In some examples, $R_1$ and $R_4$ are connected with Acceptor 1 and/or Acceptor 2. In some examples, $R_2$ and $R_3$ are connected with Acceptor 1 and/or Acceptor 2. In some examples, $R_2$ and $R_4$ are connected with Acceptor 1 and/or Acceptor 2. In some examples, $R_5$ and $R_7$ are connected with Donor 1 and/or Donor 2. In some examples, $R_5$ and $R_8$ are connected with Donor 1 and/or Donor 2. In some examples, $R_6$ and $R_7$ are connected with Donor 1 and/or Donor 2. In some examples, $R_6$ and $R_8$ are connected with Donor 1 and/or Donor 2. In some examples, the connection between $R_1$, $R_2$, $R_3$, and/or $R_4$ to Acceptor 1 and/or Acceptor 2 are, independently, direct connections or connections via an intermediary functionality. In some examples, the connection between $R_5$, $R_6$, $R_7$, and/or $R_8$ to Donor 1 and/or Donor 2 are, independently, direct connections or connections via an intermediary functionality.

In some examples, Acceptor 1 and Acceptor 2 are independently selected from the group comprising:

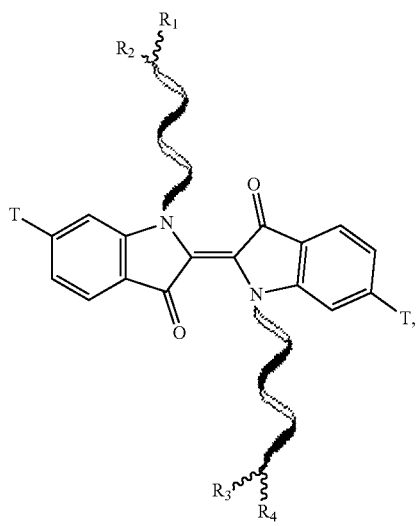

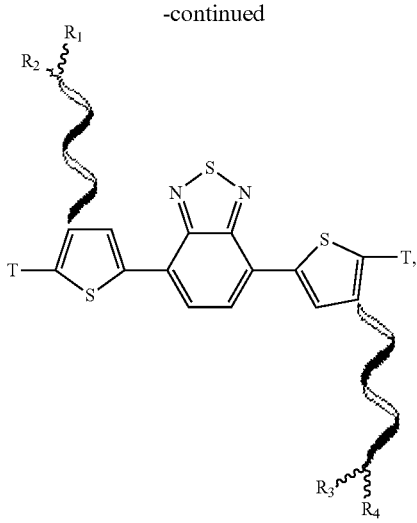

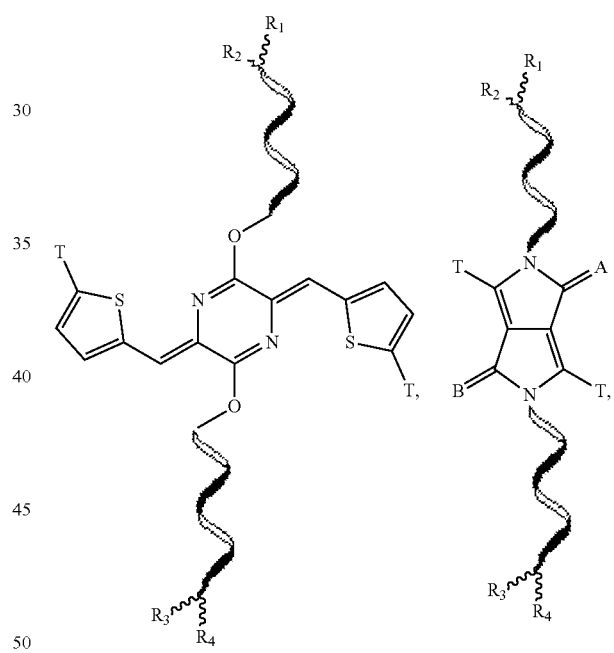

wherein A and B may be, independently, either S or O, and T is a connection terminus to at least one of Donor 1 or Donor 2.

In some examples, Donor 1 and Donor 2 are independently selected from the group comprising: thiophene, benzene, fused thiophene, or combinations thereof. In some examples, at least one of Acceptor 1, Acceptor 2, Donor 1, or Donor 2 comprises at least one UV-curable side chain. In some examples, at least one of $R_5$, $R_6$, $R_7$, and $R_8$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof. In some examples, at least one of $R_1$, $R_2$, $R_3$, and $R_4$ comprise acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In some examples, the OSC has a solubility of 0.5 mg/mL, 1 mg/mL, 2 mg/mL, 3 mg/mL, 4 mg/mL, 5 mg/mL, 10 mg/mL, 15 mg/mL, 20 mg/mL, 25 mg/mL, 30 mg/mL, 35 mg/mL, 40 mg/mL, or any value therein, or any range defined by any two of those endpoints. In some examples, the OSC has a solubility of 1 mg/mL or more at room temperature.

In some examples, the OSC has hole mobilities of 1 $cm^2$ $V^{-1}$ $s^{-1}$, 2 $cm^2$ $V^{-1}$ $s^{-1}$, 3 $cm^2$ $V^{-1}$ $s^{-1}$, 4 $cm^2$ $V^{-1}$ $s^{-1}$, 5 $cm^2$ $V^{-1}$ $s^{-1}$, 10 $cm^2$ $V^{-1}$ $s^{-1}$, 15 $cm^2$ $V^{-1}$ $s^{-1}$, 20 $cm^2$ $V^{-1}$ $s^{-1}$, 25 $cm^2$ $V^{-1}$ $s^{-1}$, 30 $cm^2$ $V^{-1}$ $s^{-1}$, 35 $cm^2$ $V^{-1}$ $s^{-1}$, 40 $cm^2$ $V^{-1}$ $s^{-1}$, or any value therein, or any range defined by any two of those endpoints. The hole mobilities may be equal to or greater than any of these values. In some examples, the OSC has hole mobilities of 1 to 4 $cm^2 V^{-1}$ $s^{-1}$. In some examples, the OSC has hole mobilities of 2 $cm^2 V^{-1}$ $s^{-1}$. In some examples, the OSC has hole mobilities of 2 $cm^2 V^{-1}$ $s^{-1}$ or more.

In some examples, the OSC polymers have On/Off ratios of greater than $10^5$. In some examples, the OSC polymers have On/Off ratios of greater than $10^6$.

In some examples, the OSC polymers have a threshold voltage in thin film transistor devices of −20V, −15V, −10V, −5V, −4V, −3V, −2V, −1V, 0V, 1V, 2V, 3V, 4V, 5V, 10V, 15V, 20V, or any value therein or any range defined by any two of those endpoints. In some examples, the OSC polymers have a threshold voltage in a range of 1 V to 3 V in thin film transistor devices. In some examples, the OSC polymers have a threshold voltage of 2 V in thin film transistor devices.

The OSC polymer disclosed herein (e.g., with at least one UV-curable side chain), enables direct UV crosslinking and patterning, thereby leading to improved patterning effects and OFET devices performance. For example, compared with conventional photolithography (described in FIGS. 1A to 1E), directly UV curable cross-bred OSC polymers reduce the number of pattern processing steps to only two steps (e.g., FIGS. 2A to 2C). Traditional processing steps, such as coating with compatible photoresists, etching the active material, and resist stripping become unnecessary due to the intrinsic UV patternability of the cross-bred OSC polymers disclosed herein. This reduction of manufacturing steps has a direct benefit in avoiding device performance degradation, since contact with potentially harmful solvents during resist coating and aggressive plasma etching atmospheres are avoided. Moreover, the reduction of steps may also significantly reduce manufacturing cost, equipment investment, as well as shorten the manufacturing cycle in OTFT manufacturing.

The disclosed cross-bred OSC polymers having the at least one UV-curable side chain have no phase separation issues and have stronger solvent resistance due to covalent-bond crosslinking. Thus, they are easier to process, leading to better reproducibility for solution processable OSC thin films. The chemical and physical properties of the cross-bred OSC polymers disclosed herein are also highly tunable by manipulating ratios among different monomers. The cross-linked OSC polymer networks formed using the disclosed cross-bred OSC polymers having the at least one UV-curable side chain help polymer chain alignment at elevated temperatures, offering higher temperature resistance of OTFT devices made thereof, as well as longer device life time and higher weatherability.

Crosslinker

In some examples, a polymer blend comprises at least one organic semiconductor (OSC) polymer and at least one crosslinker, such that the crosslinker includes at least one of: acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or a combination thereof. In some examples, the at least one crosslinker comprises C=C bonds, thiols, oxetanes, halides, azides, or combinations thereof.

In some examples, the crosslinker may be a small molecule or a polymer that reacts with the OSC polymer by one or a combination of reaction mechanisms, depending on functional moieties present in the crosslinker molecule. For example, crosslinkers comprising thiol groups may react with double bonds in the OSC polymer via thiol-ene click chemistry. In some examples, crosslinkers comprising vinyl groups may react with double bonds in the OSC polymer via addition reaction. In some examples, crosslinkers (comprising thiols, vinyl groups, etc., or combinations thereof) may react with crosslinkable functionalities incorporated in the side chains of OSC polymers. These include, for example, acrylates, epoxides, oxetanes, alkenes, alkynes, azides, thiols, allyloxysilanes, phenols, anhydrides, amines, cyanate esters, isocyanate esters, silyl hydrides, chalones, cinnamates, coumarins, fluorosulfates, silyl ethers, or combinations thereof.

In one aspect, which is combinable with any of the other aspects or embodiments, the at least one crosslinker comprises at least one of:

TABLE 1
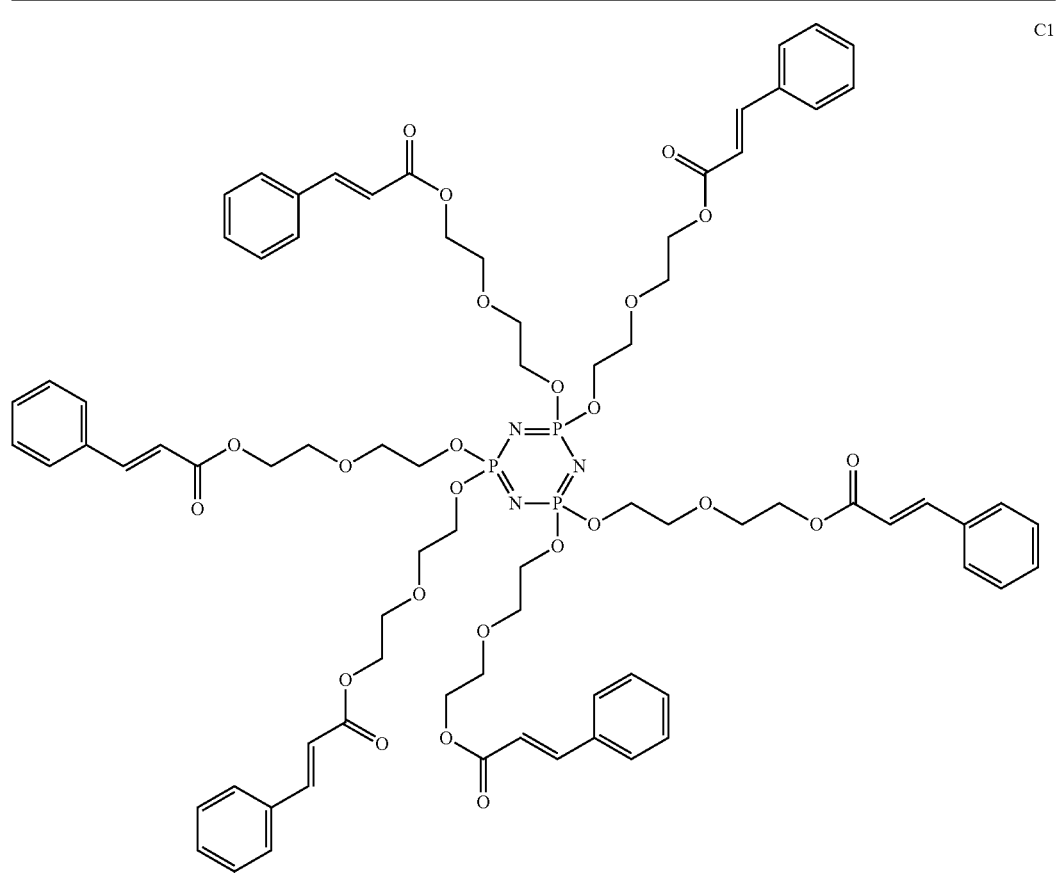
C1
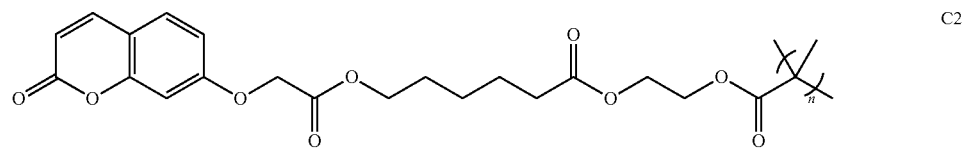
C2

TABLE 1-continued

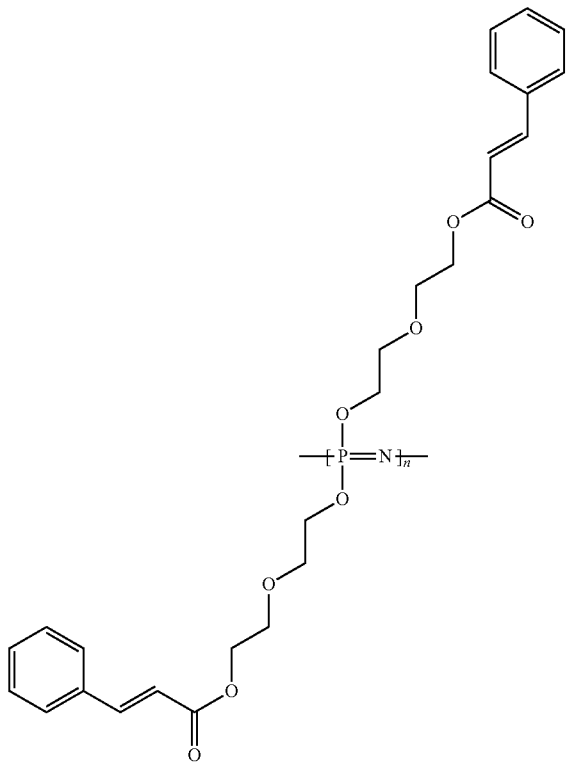

C3

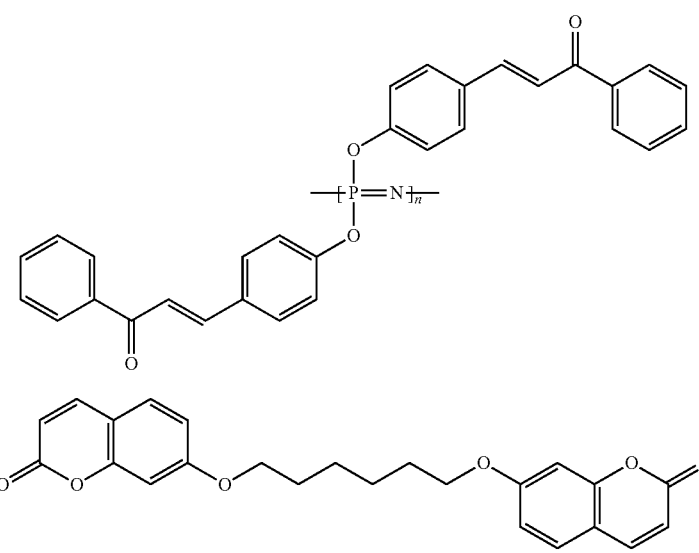

C4

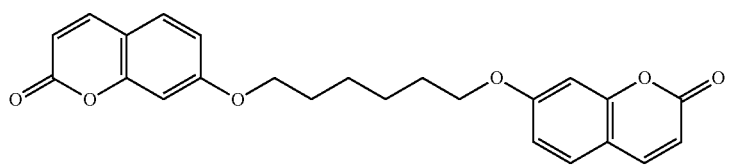

C5

Photosensitizer

In some examples, a polymer blend comprises at least one OSC polymer, at least one crosslinker, and at least one photosensitizer. In some examples, a polymer blend comprises at least one OSC polymer and at least one photosensitizer.

Photosensitizers are molecules that enable a chemical change in another molecule in a photochemical process and which may be used in photo-polymerization, photo-cross-linking, and photo-degradation polymer chemistry reactions. Photosensitizers are also used to generate triplet excited states in organic molecules for use in photocatalysis, photon up-conversion and photodynamic therapy. Functionally, photosensitizers absorb ultraviolet (UV) or visible electromagnetic radiation and transfer that energy to potentially ionize adjacent molecules. Moreover, photosensitizers usually have large de-localized π systems, which lowers the energy of HOMO orbitals.

In some examples, the at least one photosensitizer may include those with chemical structures shown in Table 2 below:

TABLE 2

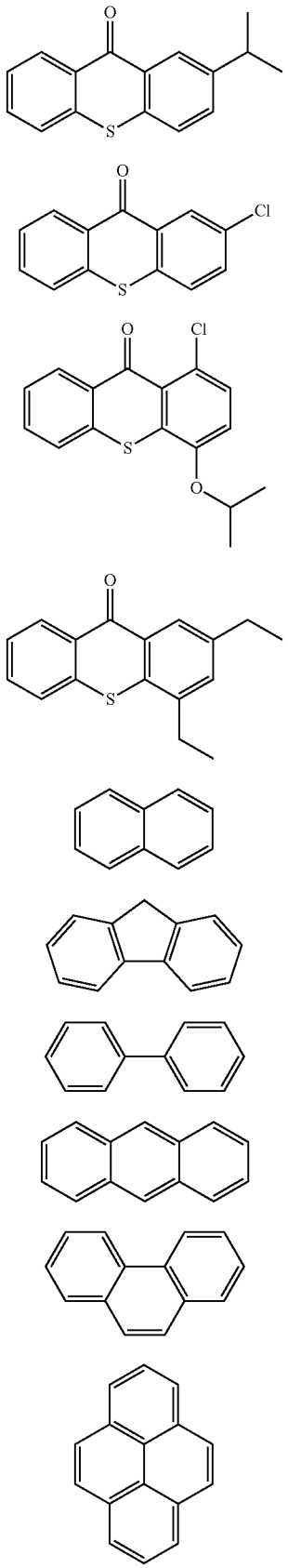

P1
P2
P3
P4
P5
P6
P7
P8
P9
P10

TABLE 2-continued

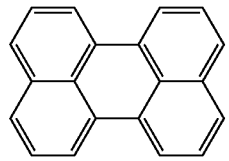

P11

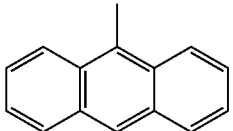

P12

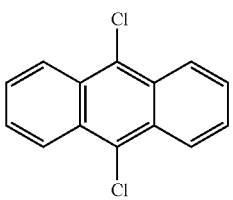

P13

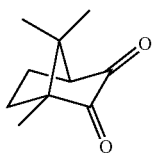

P14

Additives

In some examples, a polymer blend comprises at least one OSC polymer, at least one crosslinker, at least one photosensitizer, and at least one additive, such as antioxidants (i.e., oxygen inhibitors), lubricants, compatibilizers, leveling agents, nucleating agents, or combinations thereof. In some examples, oxygen inhibitors include phenols, thiols, amines, ethers, phosphites, organic phosphines, hydroxylamines, or combinations thereof. In some examples, a polymer blend comprises at least one OSC polymer, at least one photosensitizer, and at least one additive.

Polymer Blend

In some examples, the performance of a device comprising the OSC polymer may be improved by blending the OSC polymer with a crosslinker. In some examples, the OSC polymer is blended with a crosslinker in a solvent. In some examples, the solvent is chloroform, methylethylketone, toluene, xylenes, chlorobenzene, 1,2-dichlorobenzene, 1,2,4-trichlorobenzene, tetralin, naphthalene, chloronaphthalene, or combinations thereof. In some examples, a mixture of more than one solvent may be used.

In some examples, the at least one OSC polymer is present in a range of 1 wt. % to 99 wt. %, or in a range of 5 wt. % to 95 wt. %, or in a range of 10 wt. % to 90 wt. %, or in a range of 25 wt. % to 85 wt. %, or in a range of 50 wt. % to 80 wt. %. In some examples, the at least one OSC polymer is present at 1 wt. %, or 2 wt. %, or 3 wt. %, or 5 wt. %, or 10 wt. %, or 15 wt. %, or 20 wt. %, or 25 wt. %, or 30 wt. %, or 35 wt. %, or 40 wt. %, or 50 wt. %, or 60 wt. %, or 70 wt. %, or 80 wt. %, or 90 wt. %, or 95 wt. %, or 99 wt. %, or any range defined by any two of those endpoints.

In some examples, the at least one crosslinker is present in a range of 1 wt. % to 99 wt. %, or in a range of 5 wt. % to 95 wt. %, or in a range of 10 wt. % to 90 wt. %, or in a range of 15 wt. % to 85 wt. %, or in a range of 20 wt. % to 80 wt. %, or in a range of 25 wt. % to 75 wt. %, or in a range of 25 wt. % to 65 wt. %, or in a range of 25 wt. % to 55 wt. %. In some examples, the at least one crosslinker is present at 0.1 wt. %, or 0.2 wt. %, or 0.3 wt. %, or 0.5 wt. %, or 0.8 wt. %, or 1 wt. %, or 2 wt. %, or 3 wt. %, or 5 wt. %, or 10 wt. %, or 15 wt. %, or 20 wt. %, or 25 wt. %, or 30 wt. %, or 35 wt. %, or 40 wt. %, or 45 wt. %, or 50 wt. %, or 55 wt. %, or 60 wt. %, or 65 wt. %, or 70 wt. %, or 75 wt. %, or 80 wt. %, or 85 wt. %, or 90 wt. %, or 95 wt. %, or 99 wt. %, or any range defined by any two of those endpoints. In some examples, the at least one crosslinker comprises a first crosslinker and a second crosslinker, the first crosslinker being present in a range of 30 wt. % to 50 wt. % and the second crosslinker being present in a range of 0.5 wt. % to 25 wt. %.

In some examples, the at least one photosensitizer is present in a range of 0.1 wt. % to 10 wt. %; or in a range of 0.2 wt. % to 8 wt. %, or in a range of 0.3 wt. % to 6 wt. %, or in a range of 0.4 wt. % to 5 wt. %, or in a range of 0.5 wt. % to 4.5 wt. %, or in a range of 0.5 wt. % to 4 wt. %, or in a range of 0.6 wt. % to 3.5 wt. %, or in a range of 0.7 wt. % to 3 wt. %. In some examples, the at least one photosensitizer is present at 0.1 wt. %, or 0.2 wt. %, or 0.3 wt. %, or 0.4 wt. %, or 0.5 wt. %, or 0.6 wt. %, or 0.7 wt. %, or 0.8 wt. %, or 0.9 wt. %, or 1 wt. %, or 1.5 wt. %, or 2 wt. %, or 2.5 wt. %, or 3 wt. %, or 3.5 wt. %, or 4 wt. %, or 4.5 wt. %, or 5 wt. %, or 6 wt. %, or 7 wt. %, or 8 wt. %, or 9 wt. %, or 10 wt. %, or any range defined by any two of those endpoints.

In some examples, the at least one OSC polymer is present in a range of 1 wt. % to 99 wt. %; the at least one crosslinker is present in a range of 1 wt. % to 99 wt. %; and the at least one photosensitizer is present in a range of 0.1 wt. % to 10 wt. %. In some examples, the at least one OSC polymer is present in a range of 50 wt. % to 80 wt. %; and the at least one crosslinker is present in a range of 25 wt. % to 55 wt. %.

In some examples, the at least one antioxidant, lubricant, compatibilizer, leveling agent, or nucleating agent may each be present, independently, in a range of 0.05 wt. % to 5 wt. %, or in a range of 0.1 wt. % to 4.5 wt. %, or in a range of 0.2 wt. % to 4 wt. %, or in a range of 0.3 wt. % to 3.5 wt. %, or in a range of 0.4 wt. % to 3 wt. %, or in a range of 0.5 wt. % to 2.5 wt. %. In some examples, the at least one antioxidant, lubricant, compatibilizer, leveling agent, or nucleating agent may each be present, independently, at 0.05 wt. %, or 0.1 wt. %, or 0.2 wt. %, or 0.3 wt. %, or 0.4 wt. %, or 0.5 wt. %, or 0.6 wt. %, or 0.7 wt. %, or 0.8 wt. %, or 0.9 wt. %, or 1 wt. %, or 1.5 wt. %, or 2 wt. %, or 2.5 wt. %, or 3 wt. %, or 3.5 wt. %, or 4 wt. %, or 4.5 wt. %, or 5 wt. %, or any range defined by any two of those endpoints.

In some examples, the blend consists of OSC polymers as described herein. In some examples, the blend comprises at least two of: OSC polymers, crosslinkers, photosensitizers, and additives as described herein. In some examples, the blend comprises at least three of: OSC polymers, crosslinkers, photosensitizers, and additives as described herein. In some examples, the blend comprises all of: OSC polymers, crosslinkers, photosensitizers, and additives as described herein.

OTFT Device Fabrication

Applications using OTFT devices require patterning of organic semiconducting materials to prevent undesired high off-currents and crosstalk between adjacent devices. As explained above, photolithography is a common patterning technique in semiconductor device fabrication. However, photolithography usually involves harsh $O_2$ plasma during pattern transfer or photoresist removal and aggressive developing solvents which may severely damage the OSC layer and lead to significant deterioration of OTFT device performance. In other words, conjugated organic materials tend to degrade when exposed to light and the chemicals used in photolithography may have an adverse effect on organic thin film transistors. Therefore, patterning of organic semiconducting materials using photolithography is not practical.

FIGS. 1A to 1E illustrate traditional patterning techniques 100 of organic semiconductor blends utilizing photoresists. In a first step (FIG. 1A), a thin film 104 of the blended OSC polymer is deposited over a substrate 102 followed by deposition of a photoresist layer 106 thereon in FIG. 1B. Optionally, the thin film 104 may be thermally annealed. The photoresist deposition may be conducted using processes known in the art such as spin coating. For example, the photoresist, rendered into a liquid form by dissolving the solid components in a solvent, is poured onto the substrate, which is then spun on a turntable at a high speed producing the desired film. Thereafter, the resulting resist film may experience a post-apply bake process (i.e., soft-bake or prebake) to dry the photoresist in removing excess solvent.

In the step of FIG. 1C, the photoresist layer 106 is exposed to UV light 112 through a master pattern called a photomask 108 positioned some distance away from the photoresist layer 106 to form a higher crosslinked portion 110 of the photoresist layer 106. The exposure to UV light operates to change the solubility of the photoresist in a subsequent developer solvent solution for pattern formation atop the substrate. Prior to the developer, the resist layer may experience a post exposure bake. In the step of FIG. 1D, the pattern 116 of the photoresist layer is transferred into the thin film 104 via subtractive etching 114 (i.e., $O_2$ plasma dry etching). The patterned photoresist layer 116 "resists" the etching and protects the material covered by the photoresist. When the etching is complete, the photoresist is stripped (e.g., using organic or inorganic solutions, and dry (plasma) stripping) leaving the desired pattern 118 etched into the thin film layer.

However, as explained above, aspects of traditional photolithography processes such as harsh $O_2$ plasma during pattern transfer and aggressive photoresist developer solvents and/or stripping solvents may severely damage the OSC layer and lead to significant deterioration of device performance.

Figure 2B:
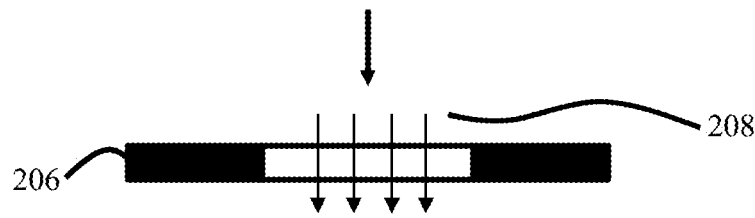
Figure 2B:
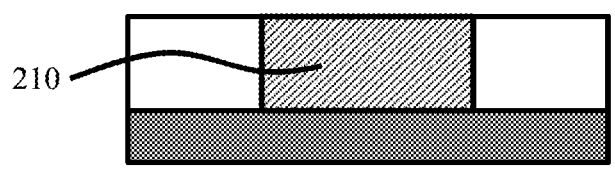
Figure 2C:
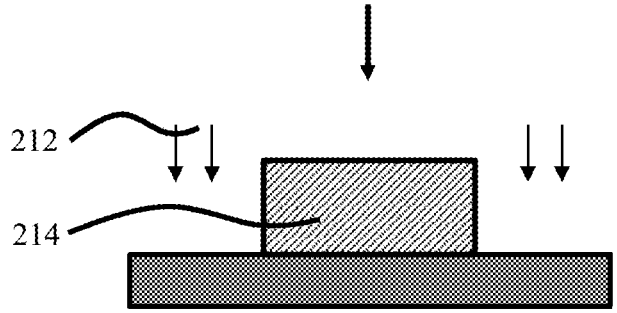

FIGS. 2A to 2C illustrate patterning techniques 200 of organic semiconductor blends, according to some embodiments. In a first step (FIG. 2A), a thin film 204 of the blended OSC polymer is deposited over a substrate 202. Optionally, the thin film 204 may be thermally annealed. In some examples, depositing comprises at least one of spin coating; dip coating; spray coating; electrodeposition; meniscus coating; plasma deposition; and roller, curtain and extrusion coating. The thin film 204 was prepared as a polymer blend described above comprising at least one organic semiconductor (OSC) polymer, and optionally, at least one crosslinker, at least one photosensitizer, and at least one additive.

In some examples, the blending includes dissolving the at least one OSC polymer in a first organic solvent to form a first solution, dissolving the at least one crosslinker in a second organic solvent to form a second solution, and dissolving at least one photosensitizer in a third organic solvent to form a third solution; and combining the first, second, and third solutions in any suitable order to create the polymer blend. In some examples, the first, second, and third solutions may be combined simultaneously. In some examples, the at least one OSC polymer, at least one crosslinker, and at least one photosensitizer may be prepared together in a single organic solvent. The weight compositions of each component of the polymer blend is as provided above.

In some examples, after the thin film of the blended OSC polymer is deposited over the substrate and before exposing the thin film to UV light, the thin film may be heated at a temperature in a range of 50° C. to 200° C. for a time in a range of 10 sec to 10 min to remove excess solvent.

In a second step (FIG. 2B), the thin film 204 was exposed to UV light 208 through a photomask 206 to form a higher crosslinked portion 210 of the thin film 204. In some examples, the exposing comprises exposing the thin film to UV light having an energy in a range of 10 mJ/cm$^2$ to 600 mJ/cm$^2$ (e.g., 400 mJ/cm$^2$) for a time in a range of 1 sec to 60 sec (e.g., 10 sec). In some examples, the UV light may have an energy in a range of 300 mJ/cm$^2$ to 500 mJ/cm$^2$ and be operable for a time in a range of 5 sec to 20 sec. Similar to photoresist functionality described in FIGS. 1A to 1E, the exposure to UV light operates to change the solubility of the thin film in a subsequent developer solvent solution for pattern formation atop the substrate.

In the step of FIG. 2C, when light exposure is complete, the portion of the thin film 204 not exposed to UV light 208 was stripped using a predetermined solvent 212, thereby leaving the desired pattern 214 into the thin film layer. In other words, the higher crosslinked portion 210 was developed in a solvent to remove an un-patterned region of the thin film 204. In some examples, the developing comprises exposing the un-patterned region of the thin film to a solvent comprising chlorobenzene, 1,2-dichlorobenzene, 1,3-dichlorobenzene, 1,2,4-trichlorobenzene, dioxane, p-xylene, m-xylene, toluene, cyclopentanone, cyclohexanone, methyl lactate, 2-butanone, 2-pentanone, 3-pentanone, 2-heptanone, 3-heptanone, anisole, mesitylene, decalin, butylbenzene, cyclooctane, tetralin, chloroform, or combinations thereof, for a time in a range of 10 sec to 10 min. In some examples, the developer solution comprises chlorobenzene, p-xylene, dioxane, or combinations thereof.

In some examples, after developing the patterned thin film in a solvent to remove the un-patterned region of the thin film, the thin film may be heated at a temperature in a range of 50° C. to 200° C. for a time in a range of 10 sec to 30 min.

Figure 3:
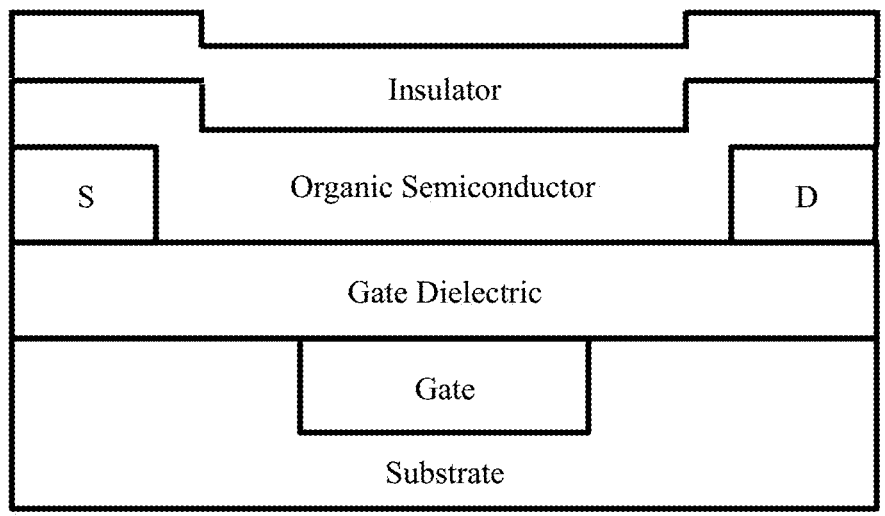
FIG. 3 illustrates an exemplary OTFT device, according to some embodiments.
Figure 4:
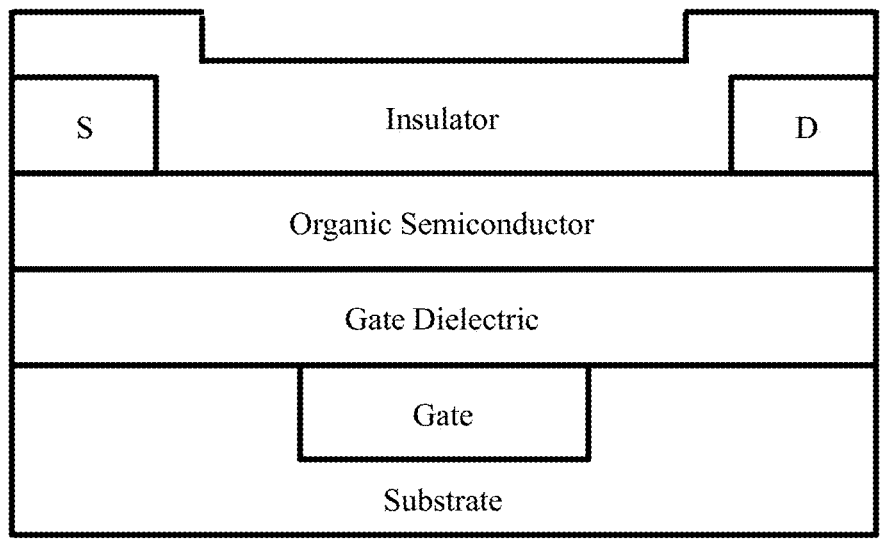
FIG. 4 illustrates an exemplary OTFT device, according to some embodiments.

Thereafter, the OTFT devices may be completed by forming a gate electrode over the substrate; forming a gate dielectric layer over the substrate; forming patterned source and drain electrodes over the gate dielectric layer; forming an organic semiconductor active layer over the and gate dielectric layer, and forming an insulator layer over the patterned organic semiconductor active layer. (FIGS. 3 and 4).

EXAMPLES

The embodiments described herein will be further clarified by the following examples.

All experimental operations are done in a fume hood unless otherwise stated.

Example 1—Synthesis of Coumarin-DPP Monomer

Figure 5:
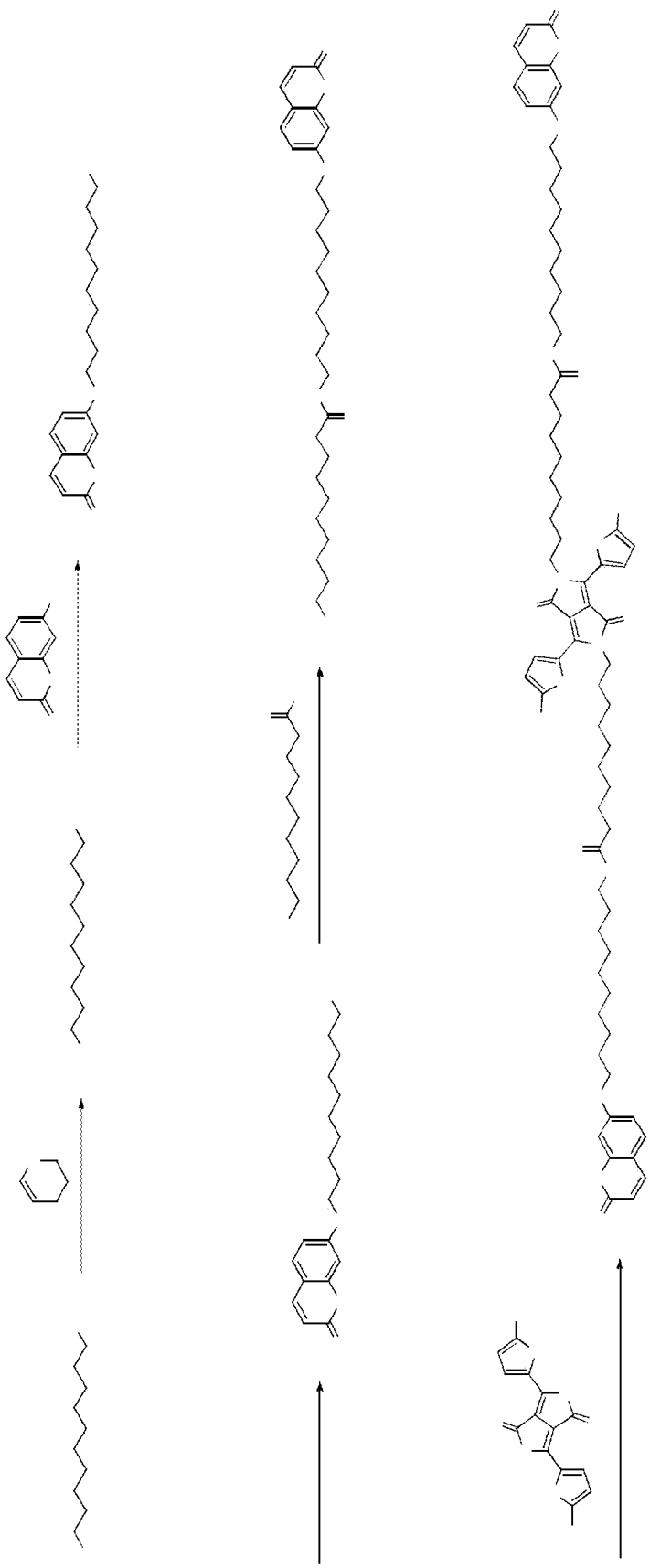
FIG. 5 illustrates synthesis of coumarin-DPP monomers, according to some embodiments.

A general synthesis of DPP monomers with coumarin side chains is shown in FIG. 5.

Step 1: Synthesis of 2-(10-bromodecyloxy)tetrahydro-2H-pyran (No 10-1)

To a solution of No 10-0 (40.00 g, 169.49 mmol) and pyridinium toluenesulfonate (PPTS; CAS No. 24057-28-1) (2.12 mg, 8.47 mmol) in $CH_2Cl_2$ (250 mL) was dropwise added 3,4-dihydro-2H-pyranin (21.35 g, 254.23 mmol) at 0° C. The reaction mixture was then warmed to room temperature (20-25° C.) and stirred overnight at room temperature. The solvent was removed under vacuum. The residue was purified by column chromatography on silica gel (petrol ether/EtOAc=20/1) to give No 10-1 (30.00 g, 55% yield) as colorless oil.

Step 2: Synthesis of 7-(10-(tetrahydro-2H-pyran-2-yloxy)decyloxy)-2H-chromen-2-one (No 10-2)

To a solution of No 10-1 (30.00 g, 93.75 mmol) in dimethylformamide (DMF) (140 mL) was added NaH (60%, 5.625 g, 140.62 mmol) under 0° C., and the reaction was stirred at 0° C. for 0.5 hr. Then 7-hydroxy-2H-chromen-2-one (15.187 g, 93.75 mmol) was added, and the reaction was stirred at 0° C. for another 0.5 hr. The resultant solution was then warmed to room temperature and stirred overnight at room temperature. Liquid-Chromatography Mass-Spectroscopy (LC-MS) characterization (Agilent LC-MS 1200-6110; column: Waters X-Bridge C18 (50 mm×4.6 mm×3.5 μm); column temperature: 40° C.) showed the starting material was consumed. The mixture was diluted with ice water (200 mL) and extracted with ethyl acetate (250 mL×3). The combined organic layers were washed with brine (100 mL×2), dried over sodium sulfate, and concentrated to dryness. The residue was purified by column chromatography on silica gel (petrol ether/EtOAc=5/1) to give No 10-2 (28.5 g, 75% yield) as white solid.

Step 3: Synthesis of 7-(10-hydroxydecyloxy)-2H-chromen-2-one (No 10-3)

To the solution of No 10-2 (24.00 g, 59.70 mmol) in MeOH (200 mL) was added p-toluenesulfonic (PTS; CAS No. 104-15-4) acid (513 mg, 2.98 mmol). The mixture was stirred overnight at room temperature, and then the solvent was removed under vacuum. The residue was purified by column chromatography on silica gel (petrol ether/EtOAc=1/1) to give No 10-3 (12.80 g, 67% yield) as a white solid.

Step 4: Synthesis of 10-(2-oxo-2H-chromen-7-yloxy)decyl 10-bromodecanoate (No 10)

To a solution of No 10-3 (12.80 g, 40.25 mmol) in dichloromethane (100 mL) was added 10-bromodecanoic acid (15.09 g, 60.37 mmol), 1-(3-dimethylaminopropyl)-3-ethylcarbodiimide hydrochloride (EDCI; CAS No. 25952-53-8) (15.37 g, 80.50 mmol) and 4-dimethylaminopyridine (DMAP; CAS No. 1122-58-3) (982 mg, 8.05 mmol), the reaction mixture was stirred overnight at room temperature. Then the solvent was removed under vacuum. The residue was purified by column chromatography on silica gel (petrol ether/EtOAc=4/1) to give No 10 (10.05 g, 45% yield) as a white solid.

Step 5: Synthesis of Coumarin-DPP Monomer

Weigh 0.9 mmol bis-brominated DPP (3,6-bis(5-bromothiophen-2-yl)pyrrolo[3,4-c]pyrrole-1,4(2H,5H)-dione), 4.0 equiv. anhydrous $K_2CO_3$, and 1.36% mmol BHT (di-tertbutylhydroxytoluene) into a 3-neck round bottom flask. The round bottom flask is then vacuumed and filled with $N_2$ with Schlenk line manifold three times. The reaction flask was connected with a condenser and to it was added anhydrous DMF (N,N-dimethylformamide, 18 mL).

An oil bath was heated from room temperature to 120° C. The reaction mixture was stirred in the oil bath for 1 hour after the oil bath temperature reaches 120° C. Thereafter, the oil bath was cooled to 105° C. Dissolved 2.4 equiv. of brominated coumarin alkyl side chain (No 10) in 4.5 mL anhydrous DMF was added dropwise to the solution in the reaction mixture. The oil bath was maintained at 105° C. for two hours and the reaction mixture was continuously stirred.

After cooling the reaction mixture to room temperature, it is poured directly into stirring ice brine. A dark solid was obtained by filtration, and then dissolved (i.e., the crude solid product) in DCM (dichloromethane). A column chromatography using alkaline aluminum oxide and DCM was carried out. Solvent DCM in the filtered solution was removed to yield a dark solid. After the dark solid is twice-recrystallized using acetone in a round bottle flask, the final coumarin-DPP monomer is dried under vacuum.

Column chromatography is a laboratory technique for the separation of a mixture. The mixture is dissolved in a fluid called the mobile phase, which carries it through a structure holding another material called the stationary phase. The various constituents of the mixture travel at different speeds, causing them to separate. The separation is based on differential partitioning between the mobile and stationary phases. Subtle differences in a compound's partition coefficient result in differential retention on the stationary phase and thus affect the separation.

Example 2—Synthesis of Coumarin-OSC Polymer

Figure 6:
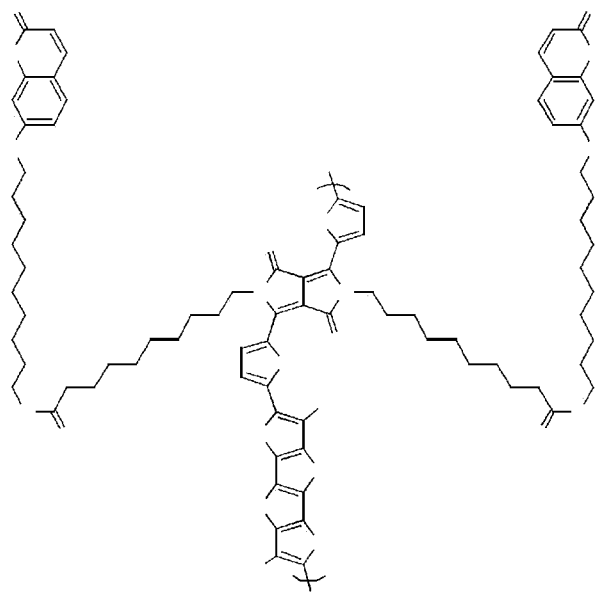
FIG. 6 illustrates synthesis of coumarin side-chain OSC polymers, according to some embodiments.
Figure 6:
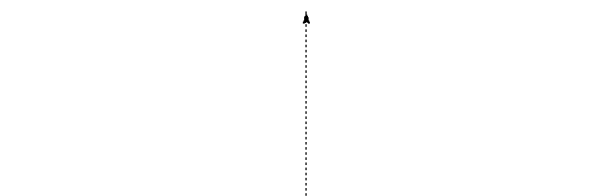
Figure 6:
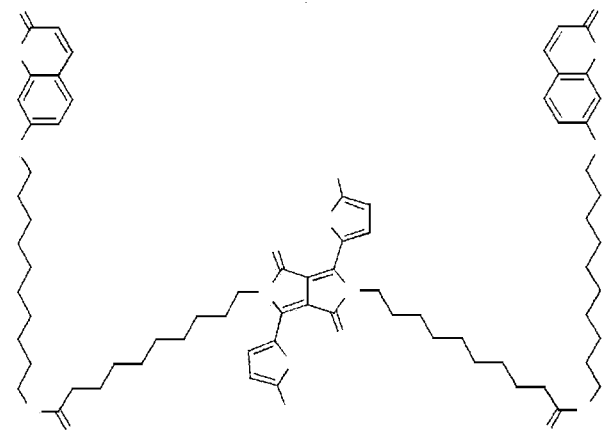

A general synthesis of coumarin-OSC polymers is exemplified in FIG. 6.

Weigh 0.6 mmol linear alkyl side chain FT4, 0.6 mmol coumarin-DPP monomer (from Example 1), 2% mmol tris (dibenzylideneacetone) dipalladium ($Pd_2(DBA)_3$; CAS No. 51364-51-3), and 8% mmol o-tolyl phosphine into a 3-neck round bottom flask. The round bottom flask is then vacuumed and filled with $N_2$ with Schlenk line manifold for three times. Connect the reaction flask with a condenser and add chlorobenzene (15 mL) to the flask. Insert a thermocouple into the reaction mixture through the septum in the third neck of the flask. The reaction mixture inner temperature was heated from room temperature to 120° C. Stir the reaction mixture in the oil bath for 1 hour after the inner temperature reaches 120° C.

While the reaction mixture is still hot, pour it directly into stirring 300 mL methanol. Then use about 50 mL methanol to wash the flask. Add conc. HCl(aq) (4 mL) and stir the mixture overnight. The polymer is then filtered from the solution using a Buchner funnel and side arm conical flask with reduced pressure. The filtrate solution is discarded. The polymer is then transferred into a Soxhlet thimble (polymer not to exceed half height of thimble) and loaded into a Soxhlet extraction apparatus. The polymer is separated via Soxhlet extraction with acetone (300 mL) for 24 hrs. The acetone solution and suspension is discarded. Soxhlet extraction is also conducted with hexane (300 mL) for 24 hrs, with the hexane solution and suspension discarded thereafter. Finally, the polymer is extracted into chloroform (300 mL) until no more material will dissolve. The polymer with precipitate by pouring the chloroform solution into a stirring beaker of acetone (400 mL) and stirring till room temperature.

The coumarin-OSC polymer is filtered from the solution using a Buchner funnel and side arm conical flask with reduced pressure; the filtrate solution is discarded. In a final step, the polymer is dried under vacuum.

Example 3—Photo-Patterning of Coumarin-OSC Polymer

The coumarin-OSC polymer (from Example 2) is dissolved in chlorobenzene at 60° C. overnight to prepare 10 mg/mL solution. After cooling to room temperature, the polymer was spin-coated on a flat surface made of either inorganic or organic material. The spin-coated film was pre-baked at 80° C. and then exposed to UV light (200-2000 $mJ/cm^2$) using a photomask.

Figure 8:
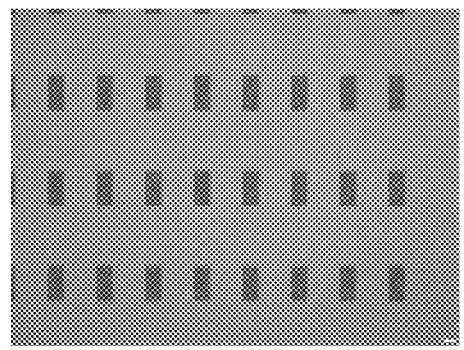
FIG. 8 illustrates a patterned coumarin-OSC polymer, according to some embodiments.

Thereafter, the film is developed in a solvent mixture, dried, and subsequently post-baked. One patterned example of the coumarin-OSC polymer is in FIG. 8. The clear patterning edges exemplify good photo patterning reproducibility, which is a prerequisite for maintaining the uniformity of devices performance.

Photo Crosslinking Based on [2+2] Cycloaddition

Figure 7:
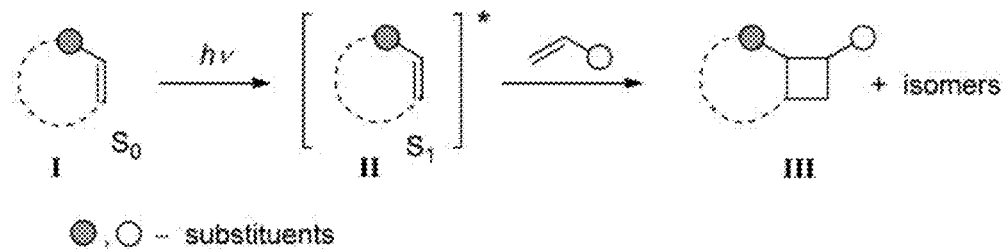
FIG. 7 illustrates a reaction pathway of [2+2] photocycloaddition of an olefin I via an excited singlet state II, according to some embodiments.

Photochemical reactions based on [2+2] photocycloaddition provides versatile and straightforward access to carbocyclic or heterocyclic (e.g., cyclobutene and derivatives thereof) organic compounds. FIG. 7 illustrates one reaction pathway of [2+2] photocycloaddition disclosed herein involving direct excitation of a given olefin (I) from the ground state ($S_0$) to its first excited singlet state $S_1$ (II) and subsequent attack by another olefin. With respect to olefins particularly suited for [2+2] cycloaddition photo crosslinking, conjugated alkenes—such as arylalkenes (e.g., styrene and stilbenes)—are preferred over non-conjugated alkenes because non-conjugated alkenes have a high lying $S_1$ state (i.e., energy gap between the ground state $S_0$ and the excited state $S_1$ of a non-conjugated alkene is larger, so that excitation of non-conjugated alkenes is more difficult than that of conjugated alkenes), and excitation with long wavelengths (k>250 nm) is not feasible. Longer wavelength lights have lower energy and it is desirable to use low energy light to enable UV crosslinking since organic compounds are more easily decomposed under higher energy radiation. In particular, olefins with double bonds conjugated to a carbonyl group have relatively long-lived excited state, which is desirable for successful intermolecular [2+2] photocycloaddition.

Though [2+2] photocycloaddition reactions can possibly proceed via either singlet- or triplet-state of excited olefins, singlet pathways are usually favored. In practice, aryl- and carbonyl-conjugated olefins (such as the UV-curable cinnamate-, coumarin-, and chalcone-based compounds of C63-C66) may be used as UV curing sites for crosslinkable polymers, as well as crosslinkers. Examples of preferred olefins include cinnamate acids and derivatives, coumarins, chalcones, among others. In some embodiments, [2+2] photocycloaddition may also be used as an immobilization strategy for organic semiconducting conjugated polymers.

Thus, for at least these reasons, conjugated alkenes, and in particular, olefins with double bonds conjugated to a carbonyl group, such as those in coumarin-OSC polymers, are desirable for successful intermolecular [2+2] photocycloaddition (i.e., due to their ability to form long-lived excited during UV crosslinking processes).

Example 4A—General Manufacturing Procedure for OTFT Device

In some examples, a bottom gate, bottom contact OTFT device can be formed as following: patterning a gold (Au) or silver (Ag) gate electrode onto a substrate, followed by spin-coating a dielectric onto the substrate and treating to obtain a gate dielectric layer. After patterning Au or Ag source and drain electrodes, an OSC layer may be formed by the materials and methods of patterning as described herein to a thickness in a range of 10 nm to 200 nm. Finally, an insulator layer was positioned. One example of the formed OTFT device is shown in FIG. 3.

Example 4B—Manufacturing of Test OTFT Device

A wafer was cleaned with deionized water and isopropyl alcohol and then treated with octadecyltrichlorosilane (OTS) at 120° C. for 60 min in vacuum. Thereafter, coumarin-OSC polymer was dissolved in chlorobenzene at 60° C. overnight to prepare 20 mg/mL solution. After cooling to room temperature, the polymer was spin-coated on the OTS-treated wafer. The spin-coated film was pre-baked at 80° C. for 2 min and then selectively exposed to a 365 nm UV light at 800 mJ/cm$^2$. A silver (Ag) electrode was evaporated on the coumarin-OSC polymer layer using 1120C type TEM copper mesh mask. Table 3 shows device performance of coumarin-OSC polymer with or without UV exposure. UV crosslinking of OSC polymers often leads to significant deterioration of device performance. The comparison in Table 3 of device performance with and without UV exposure demonstrates that under the described conditions, electronic performance of the disclosed coumarin-based OSC polymer is not sensitive to UV exposure.

TABLE 3

| Exposure conditions UV light (800 mJ/cm$^2$) | Mobility (cm$^2$/Vs) | On-current (μA) |
| --- | --- | --- |
| Without exposure | 0.301 | 182.5 |
| With exposure | 0.264 | 159.2 |

Figure 9:
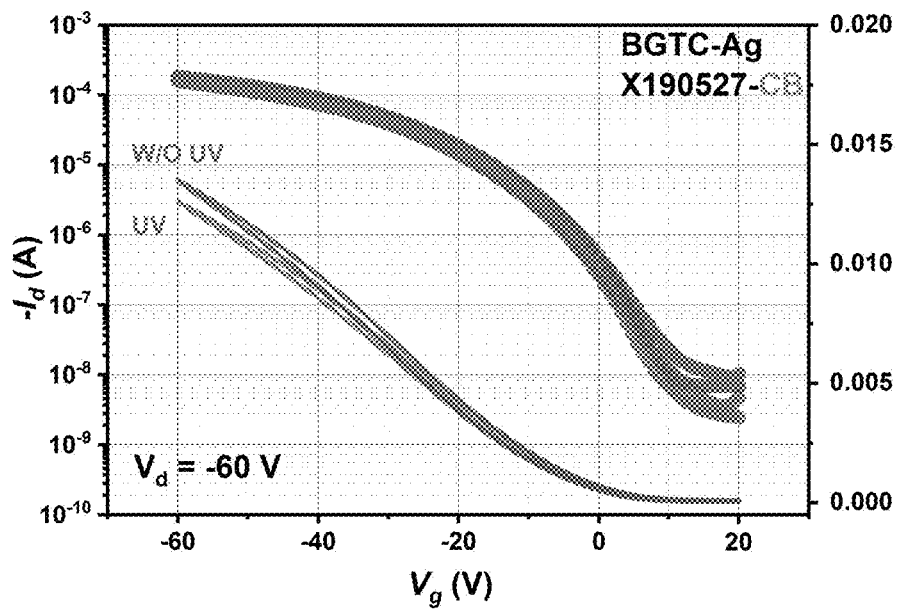
FIG. 9 illustrates device performance of a coumarin-based OSC polymer with and without UV exposure, according to some embodiments.

FIG. 9 illustrates device performance of a coumarin-based OSC polymer with and without UV exposure, according to some embodiments. Not only the mobility and on-current values of Table 3, but also the shape of the curves is an important factor in evaluating electronic performance of OSC polymers. FIG. 9 is an $I_d$-$V_g$ curve to characterize OTFT devices and shows that curve trajectory for both samples experiencing UV exposure and not experiencing UV exposure are virtually the same, indicating the very limited influence of UV crosslinking on coumarin-based OSC polymer's electronic performance. In other words, OTFT devices based on coumarin-functionalized OSC polymers showed good electronic characteristics with BGTC structures and Ag electrodes. Device performance dropped marginally after UV exposure, demonstrating the advantage of the [2+2] cycloaddition mechanism.

Thus, as presented herein, improved photo-patternable organic semiconductor polymers and uses thereof for OSC layers of organic thin-film transistors are disclosed. In particular, the synthesis and characterization of coumarin-DPP monomers and OSC polymers containing coumarin side chains are explained, as are UV-formulation design and high resolution UV-patterning experiments, and finally, manufacturing and testing of OTFT devices based on coumarin-OSC polymers.

Advantages

Comparing to conventional photolithography, UV-curable OSC polymers based on photo-induced [2+2] cycloaddition reduce the number of processing steps for patterning to only two steps. Certain traditional steps, including coating with a compatible photoresist, etching of the active material, and stripping of resist become unnecessary because the disclosed OSC polymers are intrinsically UV-crosslinkable. Reduction of steps in the manufacturing process has a direct benefit in avoiding device performance degradation and significant reduction of manufacturing costs related to equipment investment and manufacturing cycle time.

Moreover, compared to OSC polymer blends with UV curable small molecules and/or polymers crosslinkers as doping partners, the OSC polymers disclosed herein afford homogeneous film morphology without potential phase separation problems, as well as better reproducibility and reliability.

Comparing to UV curable OSC polymers based on radical crosslinking mechanism, the OSC polymers disclosed herein (e.g., based on photo-induced [2+2] and/or [4+2]mechanisms) (1) have much better thermal stability during OSC polymer synthesis, storage and materials processing; (2) do not adversely affect OTFT performance; and (3) can be directly UV crosslinked without adding radical-based photo initiators.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

As utilized herein, "optional," "optionally," or the like are intended to mean that the subsequently described event or circumstance can or cannot occur, and that the description includes instances where the event or circumstance occurs and instances where it does not occur. The indefinite article "a" or "an" and its corresponding definite article "the" as used herein means at least one, or one or more, unless specified otherwise.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

It will be apparent to those skilled in the art that various modifications and variations can be made without departing from the spirit or scope of the claimed subject matter.

Accordingly, the claimed subject matter is not to be restricted except in light of the attached claims and their equivalents.

What is claimed is:

1. A polymer blend, comprising:
   at least one organic semiconductor (OSC) polymer and at least one photosensitizer,
   wherein the at least one OSC polymer is a diketopyrrolopyrrole-fused thiophene polymeric material, wherein the fused thiophene is beta-substituted,
   wherein the polymer blend further comprises at least one crosslinker comprising:

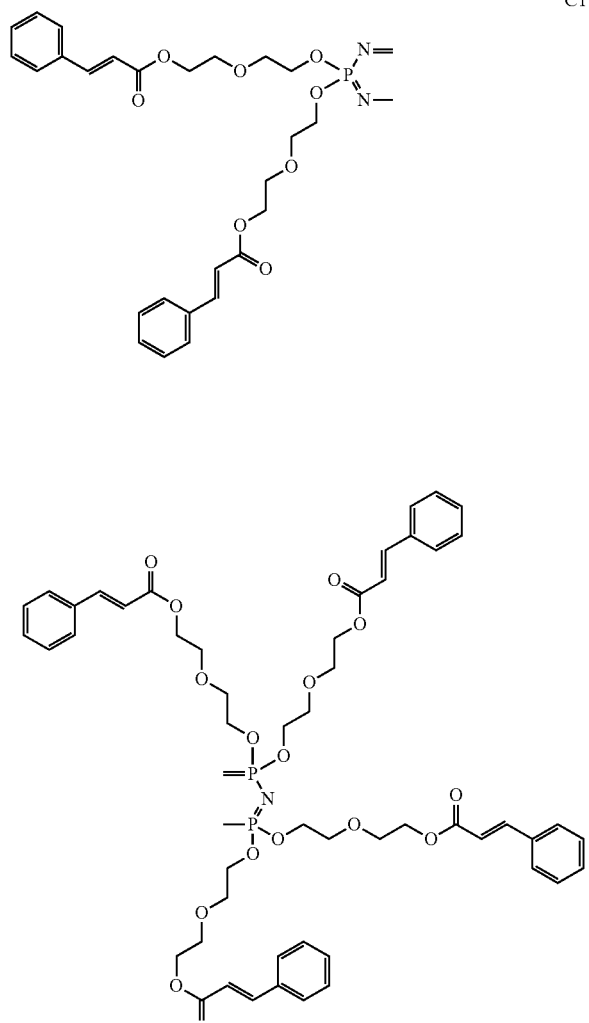

C1

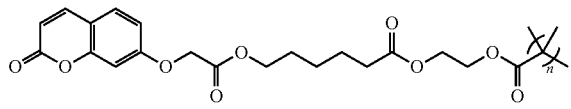

C2

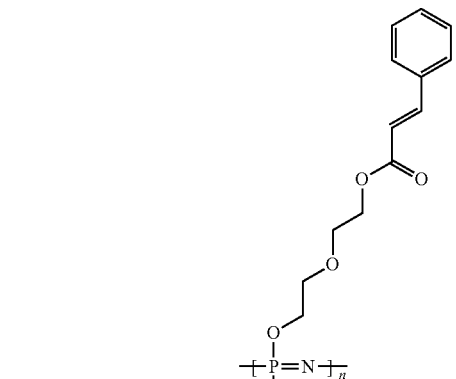

C3

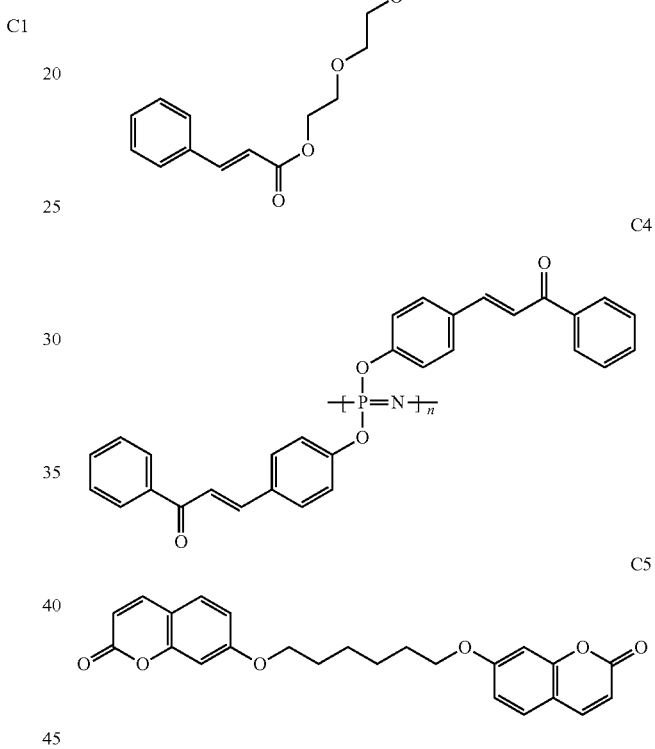

C4

C5 or combinations thereof, wherein n represents the number of repeating units in crosslinker C2, C3 or C4.

2. The polymer blend of claim 1, wherein the at least one OSC polymer comprises a first portion and a second portion, wherein at least one of the first portion or the second portion comprises at least one UV-curable side chain.

3. The polymer blend of claim 2, wherein the at least one UV-curable side chain comprises at least one of acrylates, epoxides, oxetanes, alkenes, alkynes, azides, thiols, allyloxysilanes, phenols, anhydrides, amines, cyanate esters, isocyanate esters, silyl hydrides, chalcones, cinnamates, coumarins, fluorosulfates, silyl ethers, or combinations thereof.

4. The polymer blend of claim 3, wherein the at least one UV-curable side chain comprises at least one of chalcones, cinnamates, coumarins, or combinations thereof.

5. The polymer blend of claim 1, further comprising at least one additional crosslinker comprising at least one of acrylates, epoxides, oxetanes, alkenes, alkynes, azides, thiols, allyloxysilanes, phenols, anhydrides, amines, cyanate esters, isocyanate esters, silyl hydrides, fluorosulfates, silyl ethers, or combinations thereof.

6. The polymer blend of claim 1, further comprising an additional crosslinker comprising at least one of chalcones, cinnamates, coumarins, or combinations thereof.

7. The polymer blend of claim 1, wherein the at least one photosensitizer is selected from:

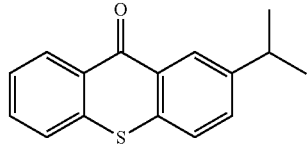

P1

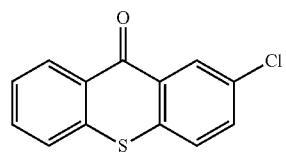

P2

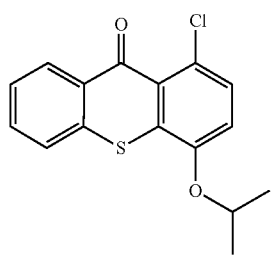

P3

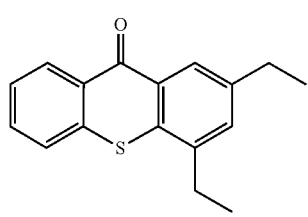

P4

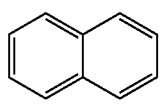

P5

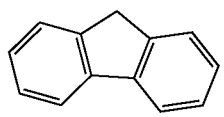

P6

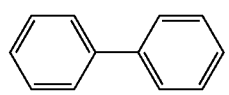

P7

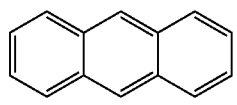

P8

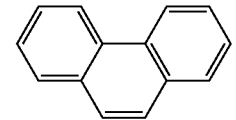

P9

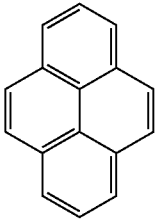

P10

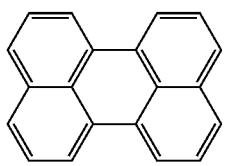

P11

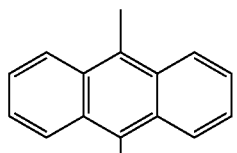

P12

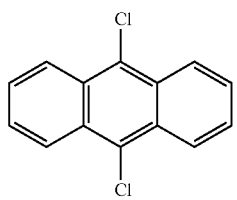

P13

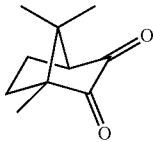

P14 or combinations thereof.

8. The polymer blend of claim 1, further comprising:
at least one of antioxidants, lubricants, compatibilizers, leveling agents, or nucleating agents present in a range of 0.05 wt. % to 5 wt. %.

9. The polymer blend of claim 1, wherein the at least one OSC polymer comprises the repeat unit of Formula 1 or Formula 2, or a salt, isomer, or analog thereof:

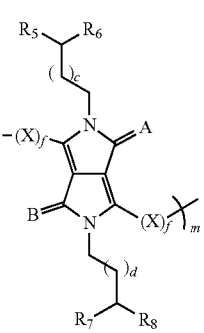

Formula 1

-continued

Formula 2

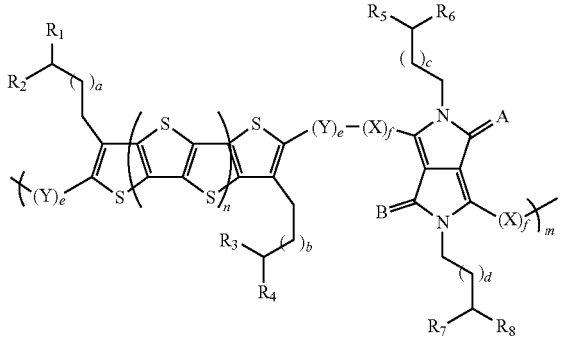

wherein in Formula 1 and Formula 2:

m is an integer greater than or equal to one;

n is 0, 1, or 2;

$R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl;

a, b, c, and d are independently, integers greater than or equal to 3;

e and f are integers greater than or equal to zero;

X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:
i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;
ii. if any of $R_1$, $R_2$, $R_3$, or $R_4$ is hydrogen, then none of $R_5$, $R_6$, $R_7$, or $R_8$ are hydrogen;
iii. if any of $R_5$, $R_6$, $R_7$, or $R_8$ is hydrogen, then none of $R_1$, $R_2$, $R_3$, or $R_4$ are hydrogen;
iv. e and f cannot both be 0;
v. if either e or f is 0, then c and d, independently, are integers greater than or equal to 5; and
vi. the polymer having a molecular weight, wherein the molecular weight of the polymer is greater than 10,000.

10. The polymer blend of claim 9, wherein for the first portion, $R_5$ and $R_7$ are hydrogen and $R_6$ and $R_8$ are substituted or unsubstituted $C_4$ or greater alkenyl.

11. The polymer blend of claim 9, wherein for the first portion and the second portion, $R_5$ and $R_7$ are hydrogen and $R_6$ and $R_8$ are substituted or unsubstituted $C_4$ or greater alkenyl.

12. The polymer blend of claim 9, wherein at least one of $R_5$, $R_6$, $R_7$, and $R_8$ comprise acrylates, epoxides, oxetanes, alkenes, alkynes, azides, thiols, allyloxysilanes, phenols, anhydrides, amines, cyanate esters, isocyanate esters, silyl hydrides, chalcones, cinnamates, coumarins, fluorosulfates, silyl ethers, or combinations thereof.

13. The polymer blend of claim 9, wherein at least one of $R_5$, $R_6$, $R_7$, and $R_8$ comprise chalcones, cinnamates, coumarins, or combinations thereof.

14. The polymer blend of claim 9, wherein at least one of $R_1$, $R_2$, $R_3$, and $R_4$ comprise acrylates, epoxides, oxetanes, alkenes, alkynes, azides, thiols, allyloxysilanes, phenols, anhydrides, amines, cyanate esters, isocyanate esters, silyl hydrides, chalcones, cinnamates, coumarins, fluorosulfates, silyl ethers, or combinations thereof.

15. The polymer blend of claim 9, wherein at least one of $R_1$, $R_2$, $R_3$, and $R_4$ comprise chalcones, cinnamates, coumarins, or combinations thereof.

16. A polymer blend, comprising:
at least one organic semiconductor (OSC) polymer and at least one photosensitizer,
wherein the at least one OSC polymer comprises a structure of Formula 7:

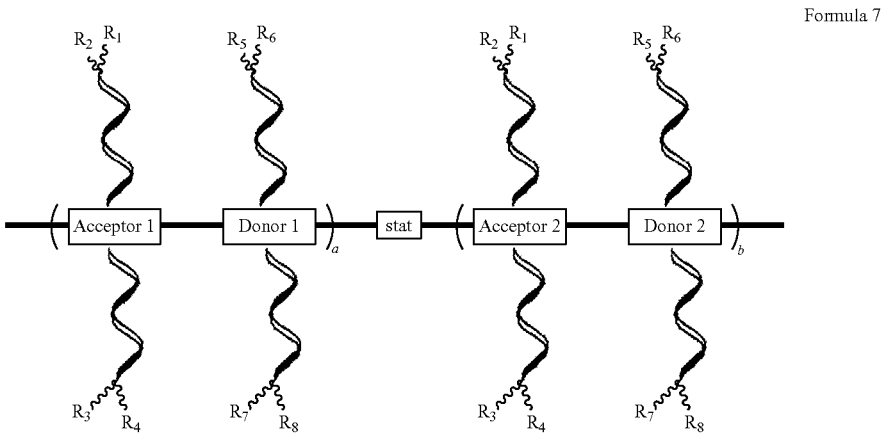

Formula 7 wherein in Formula 7:

Acceptor 1 and Acceptor 2 are each electron withdrawing groups;

Donor 1 and Donor 2 are electron-donating groups;

a and b are, independently, integers greater than or equal to one;

$R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl, wherein:
(i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;
(ii) if any of $R_1$, $R_2$, $R_3$, or $R_4$ is hydrogen, then none of $R_5$, $R_6$, $R_7$, or $R_8$ are hydrogen;
(iii) if any of $R_5$, $R_6$, $R_7$, or $R_8$ is hydrogen, then none of $R_1$, $R_2$, $R_3$, or $R_4$ are hydrogen;
(iv) one of $R_1$ or $R_2$ and one of $R_3$ or $R_4$ are, independently, connected with Acceptor 1 and Acceptor 2;
(v) one of $R_5$ or $R_6$ and one of $R_7$ or $R_8$ are, independently, connected with Donor 1 and Donor 2; and
(vi) the at least one OSC polymer has a molecular weight of greater than 10,000, wherein the polymer blend further comprises at least one crosslinker selected from

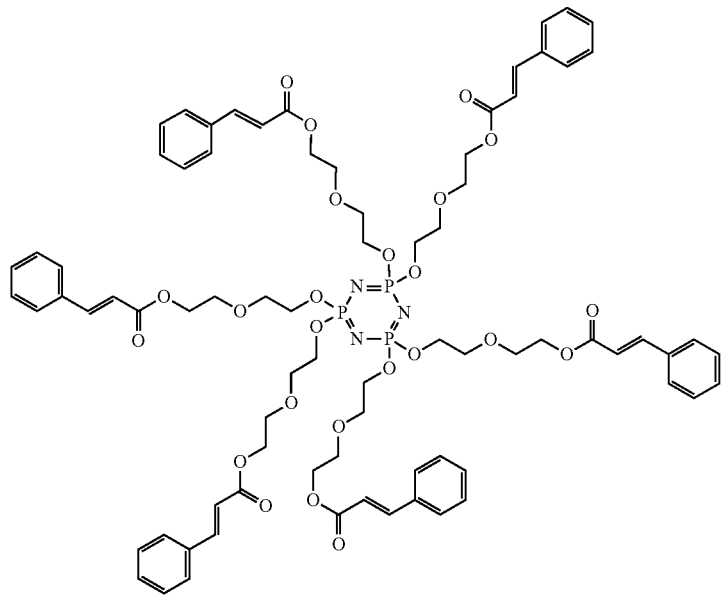 [SMILES: O=C(/C=C/c1ccccc1)OCCOCCOP1(OCCOCCOC(=O)/C=C/c2ccccc2)=NP(OCCOCCOC(=O)/C=C/c2ccccc2)(OCCOCCOC(=O)/C=C/c2ccccc2)=NP(OCCOCCOC(=O)/C=C/c2ccccc2)(OCCOCCOC(=O)/C=C/c2ccccc2)=N1]

C1

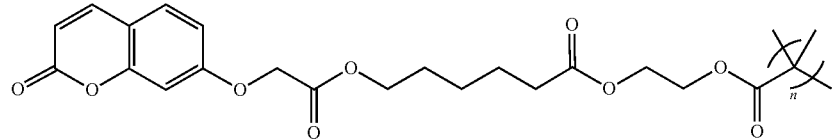

C2

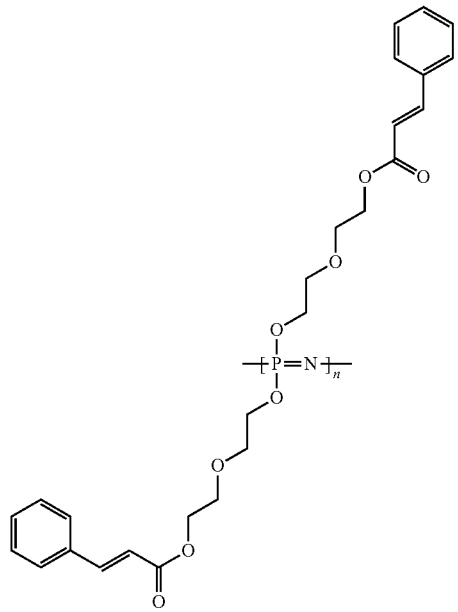

C3

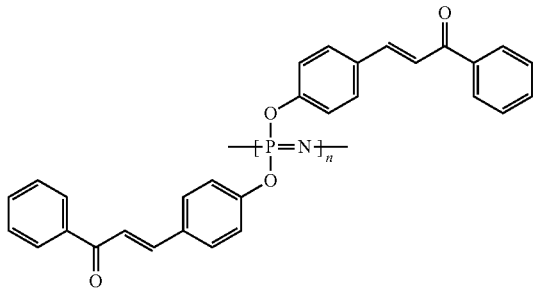

C4

-continued

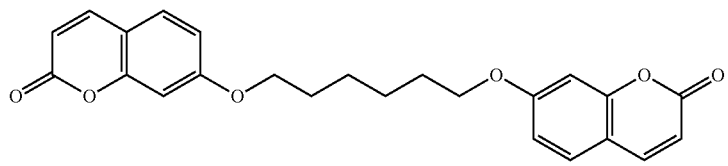 [SMILES: O=c1ccc2ccc(OCCCCCCOc3ccc4ccc(=O)oc4c3)cc2o1]
C5 or combinations thereof, wherein n represents the number of repeating units in crosslinker C2, C3 or C4.

17. The polymer blend of claim 16, wherein Acceptor 1 and Acceptor 2 are independently selected from the group comprising:

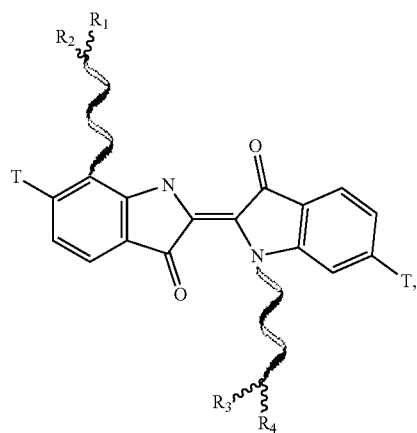

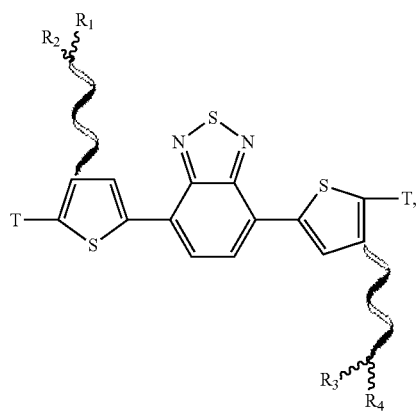

-continued

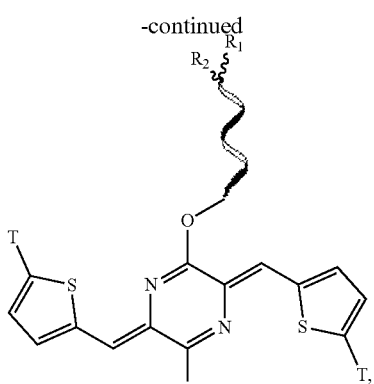

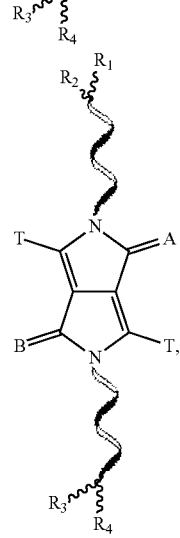

wherein A and B may be, independently, either S or O, and T is a connection terminus to at least one of Donor 1 or Donor 2.

18. The polymer blend of claim 16, wherein Donor 1 and Donor 2 are independently selected from the group comprising: thiophene, benzene, fused thiophene, or combinations thereof.

19. The polymer blend of claim 16, wherein at least one of $R_5$, $R_6$, $R_7$, and $R_8$ comprise acrylates, epoxides, oxetanes, alkenes, alkynes, azides, thiols, allyloxysilanes, phenols, anhydrides, amines, cyanate esters, isocyanate esters, silyl hydrides, chalcones, cinnamates, coumarins, fluorosulfates, silyl ethers, or combinations thereof.

20. The polymer blend of claim 16, wherein at least one of $R_1$, $R_2$, $R_3$, and $R_4$ comprise acrylates, epoxides, oxetanes, alkenes, alkynes, azides, thiols, allyloxysilanes, phenols, anhydrides, amines, cyanate esters, isocyanate esters, silyl hydrides, chalcones, cinnamates, coumarins, fluorosulfates, silyl ethers, or combinations thereof.

21. The polymer blend of claim 16, wherein the at least one photosensitizer is selected from:

P1
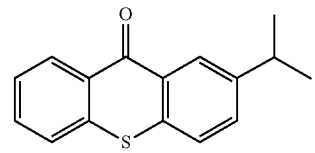 [SMILES: CC(C)c1ccc2sc3ccccc3c(=O)c2c1]

P2
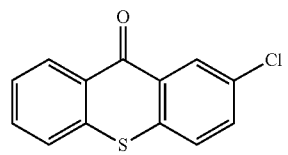 [SMILES: O=c1c2ccccc2sc2ccc(Cl)cc12]

P3
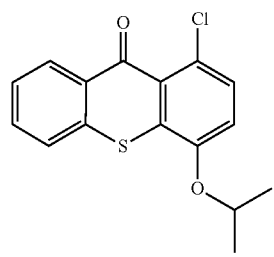 [SMILES: CC(C)Oc1ccc(Cl)c2c(=O)c3ccccc3sc12]

P4
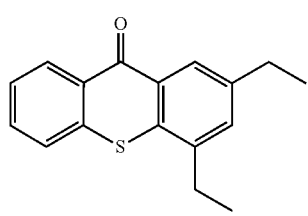

P5
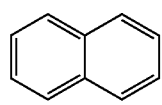

P6
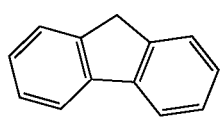

P7
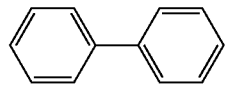 [SMILES: c1ccc(-c2ccccc2)cc1]

P8
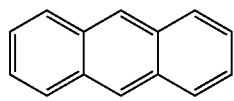 [SMILES: c1ccc2cc3ccccc3cc2c1]

-continued

P9
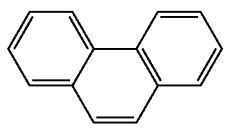

P10
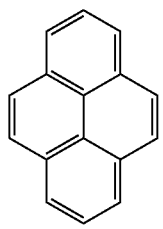 [SMILES: c1cc2ccc3cccc4ccc(c1)c2c34]

P11
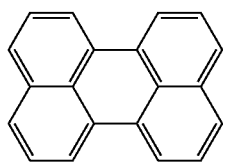 [SMILES: c1cc2cccc3c4cccc5cccc(c(c1)c23)c54]

P12
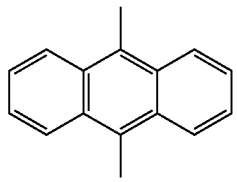 [SMILES: Cc1c2ccccc2c(C)c2ccccc12]

P13
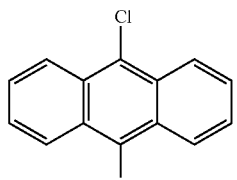

P14
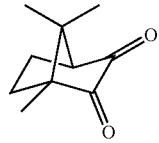

or combinations thereof.

22. A polymer blend, comprising:
at least one coumarin-based organic semiconductor (OSC) polymer and at least one photosensitizer, wherein the at least one coumarin-based OSC polymer includes a diketopyrrolopyrrole-fused thiophene polymeric material, wherein the fused thiophene is beta-substituted wherein the polymer blend further comprising at least one crosslinker selected from

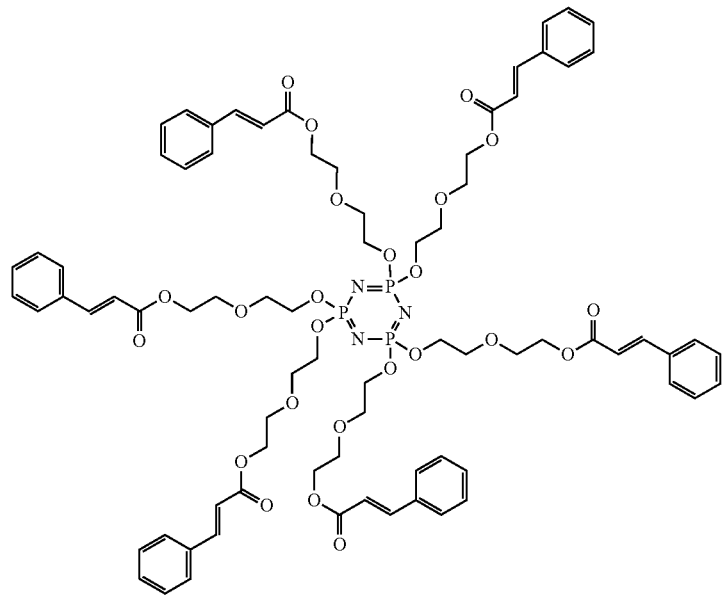
C1
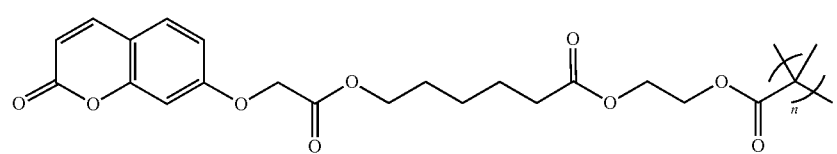
C2
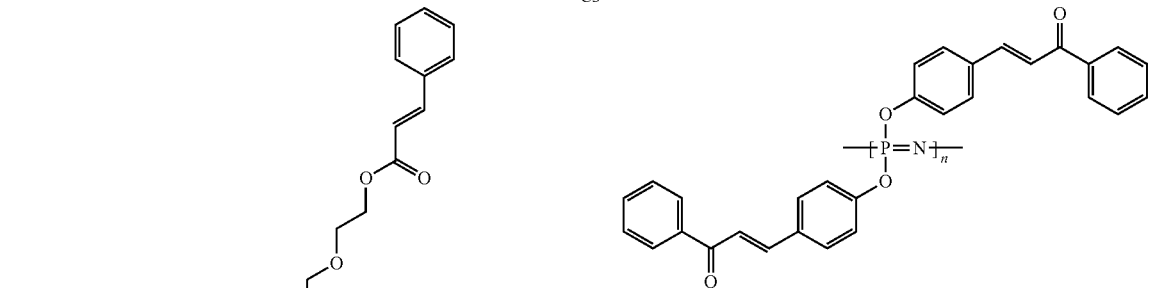
C3
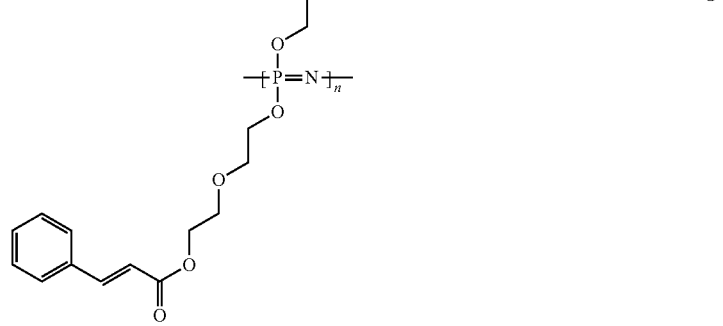
C4
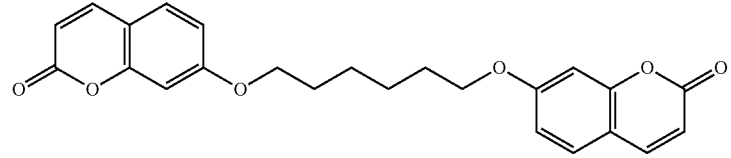
C5
or combinations thereof, wherein n represents the number of repeating units in crosslinker C2, C3 or C4.

UNITED STATES PATENT AND TRADEMARK OFFICE
CERTIFICATE OF CORRECTION

Page 1 of 1

PATENT NO. : 11,917,897 B2
APPLICATION NO. : 17/034552
DATED : February 27, 2024
INVENTOR(S) : Mingqian He et al.

It is certified that error appears in the above-identified patent and that said Letters Patent is hereby corrected as shown below:

In the Claims

In Column 44, Lines 52-67, in Claim 9, delete:

"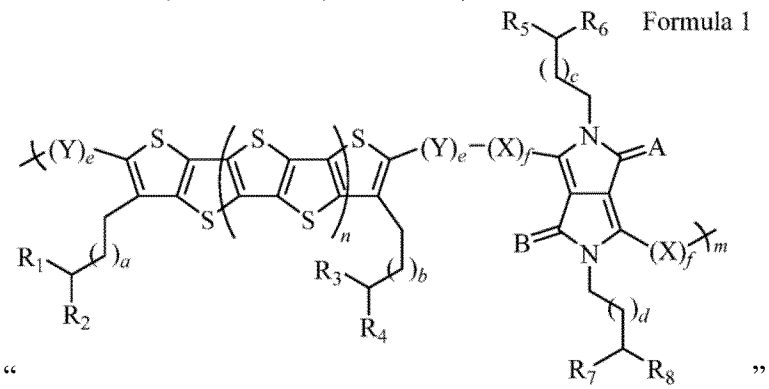"

And insert:

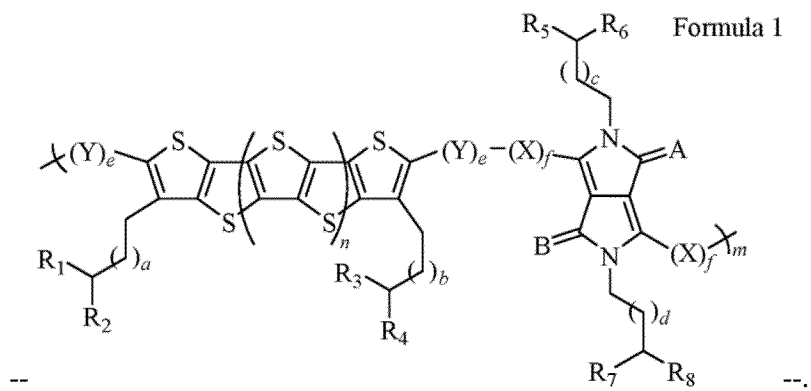

--.

Signed and Sealed this
Twentieth Day of August, 2024

Katherine Kelly Vidal
*Director of the United States Patent and Trademark Office*